(12) United States Patent
Salcedo et al.

(10) Patent No.: US 8,928,085 B2
(45) Date of Patent: Jan. 6, 2015

(54) APPARATUS AND METHOD FOR ELECTRONIC CIRCUIT PROTECTION

(71) Applicant: Analog Devices, Inc., Norwood, MA (US)

(72) Inventors: Javier Alejandro Salcedo, North Billerica, MA (US); David Casey, Limerick (IE); Graham McCorkell, Edinburgh (GB)

(73) Assignee: Analog Devices, Inc., Norwood, MA (US)

( * ) Notice: Subject to any disclaimer, the term of this patent is extended or adjusted under 35 U.S.C. 154(b) by 98 days.

(21) Appl. No.: 13/852,883

(22) Filed: Mar. 28, 2013

(65) Prior Publication Data

US 2013/0221405 A1      Aug. 29, 2013

Related U.S. Application Data

(63) Continuation of application No. 12/797,463, filed on Jun. 9, 2010, now Pat. No. 8,432,651.

(51) Int. Cl.
| | | |
|---|---|---|
| *H01L 23/60* | (2006.01) | |
| *H02H 9/00* | (2006.01) | |
| *H02H 3/24* | (2006.01) | |
| *H01L 27/06* | (2006.01) | |
| *H01L 27/02* | (2006.01) | |
| *H02H 9/04* | (2006.01) | |

(52) U.S. Cl.
CPC ............... *H01L 27/06* (2013.01); *H01L 23/60* (2013.01); *H01L 27/0251* (2013.01); *H02H 9/046* (2013.01); *H01L 2924/0002* (2013.01)
USPC ................. 257/355; 361/56; 361/86; 361/111

(58) Field of Classification Search
CPC ............ H01L 27/0259; H01L 27/0262; H01L 27/0292
USPC ................. 361/56, 86, 111; 327/565; 257/355
See application file for complete search history.

(56) References Cited

U.S. PATENT DOCUMENTS 3,436,667 A    4/1969   Kedson
4,633,283 A    12/1986  Avery
(Continued)

FOREIGN PATENT DOCUMENTS

DE    10 2007 040 875 A1    3/2009
EP         0 168 678 A2     1/1986
(Continued)

OTHER PUBLICATIONS

Anderson et al., *ESD Protection under Wire Bonding Pads*, EOS/ESD Symposium 99-88, pp. 2A.4.1-2A.4.7 (1999).

(Continued)

*Primary Examiner* — Evan Pert
(74) *Attorney, Agent, or Firm* — Knobbe, Martens, Olson & Bear, LLP

(57) ABSTRACT

Apparatus and methods for electronic circuit protection are disclosed. In one embodiment, an apparatus comprises a well having an emitter and a collector region. The well has a doping of a first type, and the emitter and collector regions have a doping of a second type. The emitter region, well, and collector region are configured to operate as an emitter, base, and collector for a first transistor, respectively. The collector region is spaced away from the emitter region to define a spacing. A first spacer and a second spacer are positioned adjacent the well between the emitter and the collector. A conductive plate is positioned adjacent the well and between the first spacer and the second spacer, and a doping adjacent the first spacer, the second spacer, and the plate consists essentially of the first type.

21 Claims, 34 Drawing Sheets

(56) References Cited

U.S. PATENT DOCUMENTS

| | | |
|---|---|---|
| 5,061,652 A | 10/1991 | Bendernagel et al. |
| 5,276,582 A | 1/1994 | Merrill et al. |
| 5,341,005 A | 8/1994 | Canclini |
| 5,343,053 A | 8/1994 | Avery |
| 5,541,801 A | 7/1996 | Lee et al. |
| 5,576,557 A | 11/1996 | Ker et al. |
| 5,615,074 A | 3/1997 | Avery |
| 5,652,689 A | 7/1997 | Yuan |
| 5,663,860 A | 9/1997 | Swonger |
| 5,742,084 A | 4/1998 | Yu |
| 5,745,323 A | 4/1998 | English et al. |
| 5,781,389 A | 7/1998 | Fukuzako et al. |
| 5,786,617 A | 7/1998 | Merrill et al. |
| 5,889,644 A | 3/1999 | Schoenfeld et al. |
| 5,895,940 A | 4/1999 | Kim |
| 5,998,813 A | 12/1999 | Bernier |
| 6,137,140 A | 10/2000 | Efland et al. |
| 6,144,542 A | 11/2000 | Ker et al. |
| 6,236,087 B1 | 5/2001 | Daly et al. |
| 6,258,634 B1 | 7/2001 | Wang et al. |
| 6,310,379 B1 | 10/2001 | Andresen et al. |
| 6,329,694 B1 | 12/2001 | Lee et al. |
| 6,403,992 B1 | 6/2002 | Wei |
| 6,404,261 B1 | 6/2002 | Grover et al. |
| 6,423,987 B1 | 7/2002 | Constapel et al. |
| 6,512,662 B1 | 1/2003 | Wang |
| 6,590,273 B2 | 7/2003 | Okawa et al. |
| 6,621,126 B2 | 9/2003 | Russ |
| 6,665,160 B2 | 12/2003 | Lin et al. |
| 6,667,870 B1 | 12/2003 | Segervall |
| 6,704,180 B2 | 3/2004 | Tyler et al. |
| 6,724,603 B2 | 4/2004 | Miller et al. |
| 6,756,834 B1 | 6/2004 | Tong et al. |
| 6,765,771 B2 | 7/2004 | Ker et al. |
| 6,768,616 B2 | 7/2004 | Mergens et al. |
| 6,870,202 B2 | 3/2005 | Oka |
| 6,960,792 B1 | 11/2005 | Nguyen |
| 6,960,811 B2 | 11/2005 | Wu et al. |
| 6,979,869 B2 | 12/2005 | Chen et al. |
| 7,034,363 B2 | 4/2006 | Chen |
| 7,038,280 B2 | 5/2006 | Righter |
| 7,071,528 B2 | 7/2006 | Ker et al. |
| 7,125,760 B1 | 10/2006 | Reese et al. |
| 7,232,705 B2 | 6/2007 | Righter |
| 7,232,711 B2 | 6/2007 | Gambino et al. |
| 7,335,543 B2 | 2/2008 | Chen et al. |
| 7,345,341 B2 | 3/2008 | Lin et al. |
| 7,385,793 B1 | 6/2008 | Ansel et al. |
| 7,436,640 B2 | 10/2008 | Su et al. |
| 7,566,914 B2 | 7/2009 | Salcedo et al. |
| 7,570,467 B2 | 8/2009 | Watanabe et al. |
| 7,601,991 B2 | 10/2009 | Salcedo et al. |
| 7,663,190 B2 | 2/2010 | Vinson |
| 7,714,357 B2 | 5/2010 | Hayashi et al. |
| 7,834,378 B2 | 11/2010 | Ryu et al. |
| 7,910,999 B2 | 3/2011 | Lee et al. |
| 7,969,006 B2 | 6/2011 | Lin et al. |
| 8,044,457 B2 | 10/2011 | Salcedo et al. |
| 8,198,651 B2 | 6/2012 | Langguth et al. |
| 8,222,698 B2 | 7/2012 | Salcedo et al. |
| 8,331,069 B2 | 12/2012 | Galy et al. |
| 8,368,116 B2 | 2/2013 | Salcedo et al. |
| 8,432,651 B2 | 4/2013 | Salcedo et al. |
| 8,466,489 B2 | 6/2013 | Salcedo et al. |
| 8,665,571 B2 | 3/2014 | Salcedo et al. |
| 2001/0040254 A1 | 11/2001 | Takiguchi |
| 2002/0021538 A1 | 2/2002 | Chen et al. |
| 2002/0081783 A1 | 6/2002 | Lee et al. |
| 2002/0109190 A1 | 8/2002 | Ker et al. |
| 2002/0122280 A1 | 9/2002 | Ker et al. |
| 2002/0187601 A1 | 12/2002 | Lee et al. |
| 2003/0038298 A1 | 2/2003 | Cheng et al. |
| 2003/0076636 A1 | 4/2003 | Ker et al. |
| 2004/0135229 A1 | 7/2004 | Sasahara |
| 2004/0164354 A1 | 8/2004 | Mergens et al. |
| 2004/0190208 A1 | 9/2004 | Levit |
| 2004/0207021 A1 | 10/2004 | Russ et al. |
| 2004/0240128 A1 | 12/2004 | Boselli et al. |
| 2005/0012155 A1 | 1/2005 | Ker et al. |
| 2005/0082618 A1 | 4/2005 | Wu et al. |
| 2005/0083623 A1* | 4/2005 | Yeh et al. .................... 361/56 |
| 2005/0087807 A1 | 4/2005 | Righter |
| 2005/0088794 A1 | 4/2005 | Boerstler et al. |
| 2005/0093069 A1 | 5/2005 | Logie |
| 2005/0151160 A1 | 7/2005 | Salcedo et al. |
| 2005/0195540 A1 | 9/2005 | Streibl et al. |
| 2006/0033163 A1 | 2/2006 | Chen |
| 2006/0109595 A1 | 5/2006 | Watanabe et al. |
| 2006/0138544 A1* | 6/2006 | Bakker .................... 257/355 |
| 2006/0145260 A1 | 7/2006 | Kim |
| 2006/0186467 A1 | 8/2006 | Pendharkar et al. |
| 2006/0258067 A1* | 11/2006 | Jeon et al. .................... 438/154 |
| 2007/0007545 A1 | 1/2007 | Salcedo et al. |
| 2007/0037355 A1* | 2/2007 | Lee et al. .................... 438/309 |
| 2007/0058307 A1 | 3/2007 | Mergens et al. |
| 2007/0158748 A1 | 7/2007 | Chu et al. |
| 2008/0044955 A1 | 2/2008 | Salcedo et al. |
| 2008/0067601 A1 | 3/2008 | Chen |
| 2009/0032838 A1 | 2/2009 | Tseng et al. |
| 2009/0034137 A1 | 2/2009 | Disney et al. |
| 2009/0045457 A1 | 2/2009 | Bobde |
| 2009/0057715 A1 | 3/2009 | Ryu et al. |
| 2009/0206376 A1 | 8/2009 | Mita et al. |
| 2009/0230426 A1 | 9/2009 | Carpenter et al. |
| 2009/0236631 A1 | 9/2009 | Chen et al. |
| 2009/0309128 A1 | 12/2009 | Salcedo et al. |
| 2010/0133583 A1 | 6/2010 | Mawatari et al. |
| 2010/0163973 A1 | 7/2010 | Nakamura et al. |
| 2010/0327343 A1 | 12/2010 | Salcedo et al. |
| 2011/0101444 A1 | 5/2011 | Coyne et al. |
| 2011/0110004 A1 | 5/2011 | Maier |
| 2011/0176244 A1 | 7/2011 | Gendron et al. |
| 2011/0284922 A1 | 11/2011 | Salcedo et al. |
| 2011/0303947 A1 | 12/2011 | Salcedo et al. |
| 2011/0304944 A1 | 12/2011 | Salcedo et al. |
| 2012/0119331 A1* | 5/2012 | Gendron et al. ............. 257/587 |
| 2012/0293904 A1 | 11/2012 | Salcedo et al. |
| 2012/0305984 A1* | 12/2012 | Campi et al. .................. 257/124 |

FOREIGN PATENT DOCUMENTS

| | | |
|---|---|---|
| EP | 1 703 560 A2 | 9/2006 |
| KR | 10-2006-0067100 | 2/2006 |
| KR | 10-2009-0123683 | 12/2009 |
| KR | 10-2010-0003569 | 1/2010 |

OTHER PUBLICATIONS

Luh et al. *A Zener-Diode-Activated ESD Protection Circuit for Sub-Micron CMOS Processes,* Circuits and Systems, IEEE International Symposium, May 28-31, 2000, Geneva, Switzerland, 4 pages.

Salcedo et al., *Electrostatic Discharge Protection Framework for Mixed-Signal High Voltage CMOS Applications,* IEEE Xplore, downloaded Feb. 23, 2010 at 12:53 Est, 4 pages.

International Preliminary Report on Patentability and Written Opinion of the International Search Authority in PCT/US2011/039095 dated Dec. 20, 2012, 8 pages.

International Preliminary Report on Patentability and Written Opinion of the International Search Authority in PCT/US2011/039054 dated Dec. 20, 2012, 8 pages.

\* cited by examiner

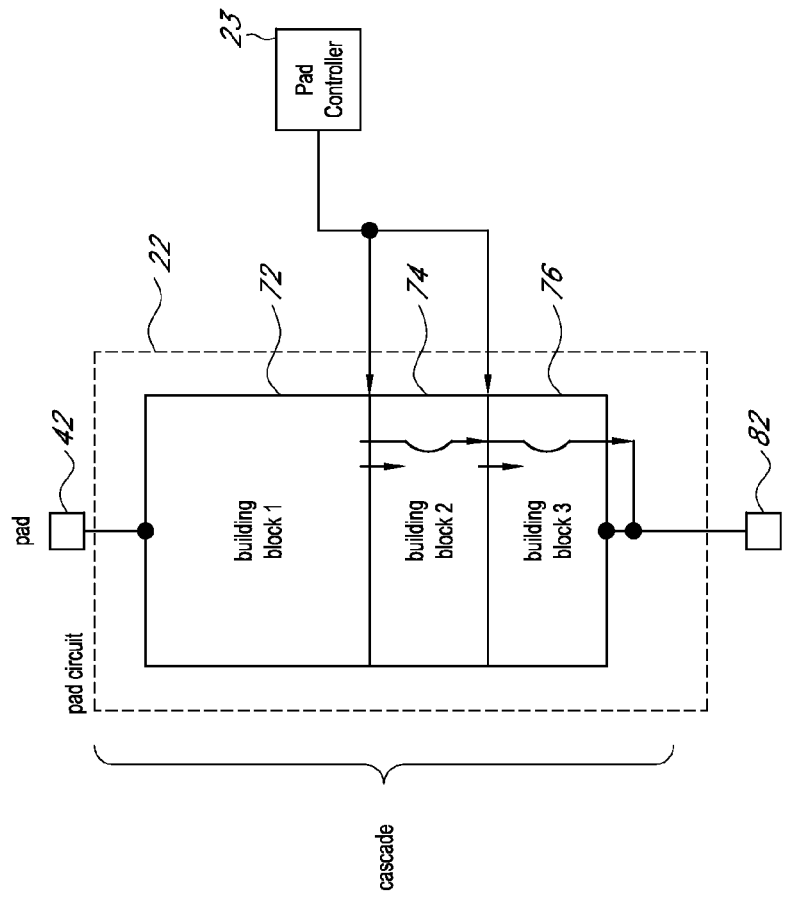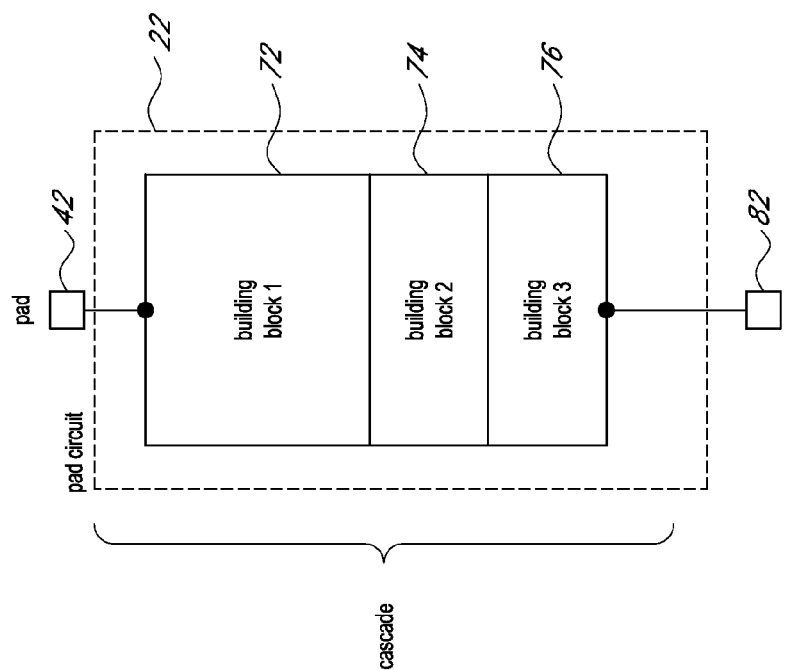

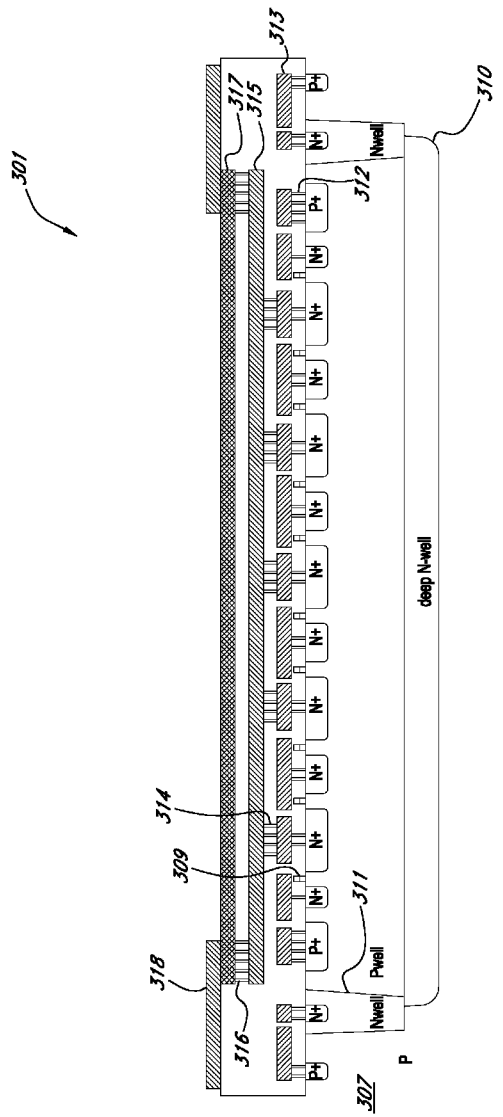

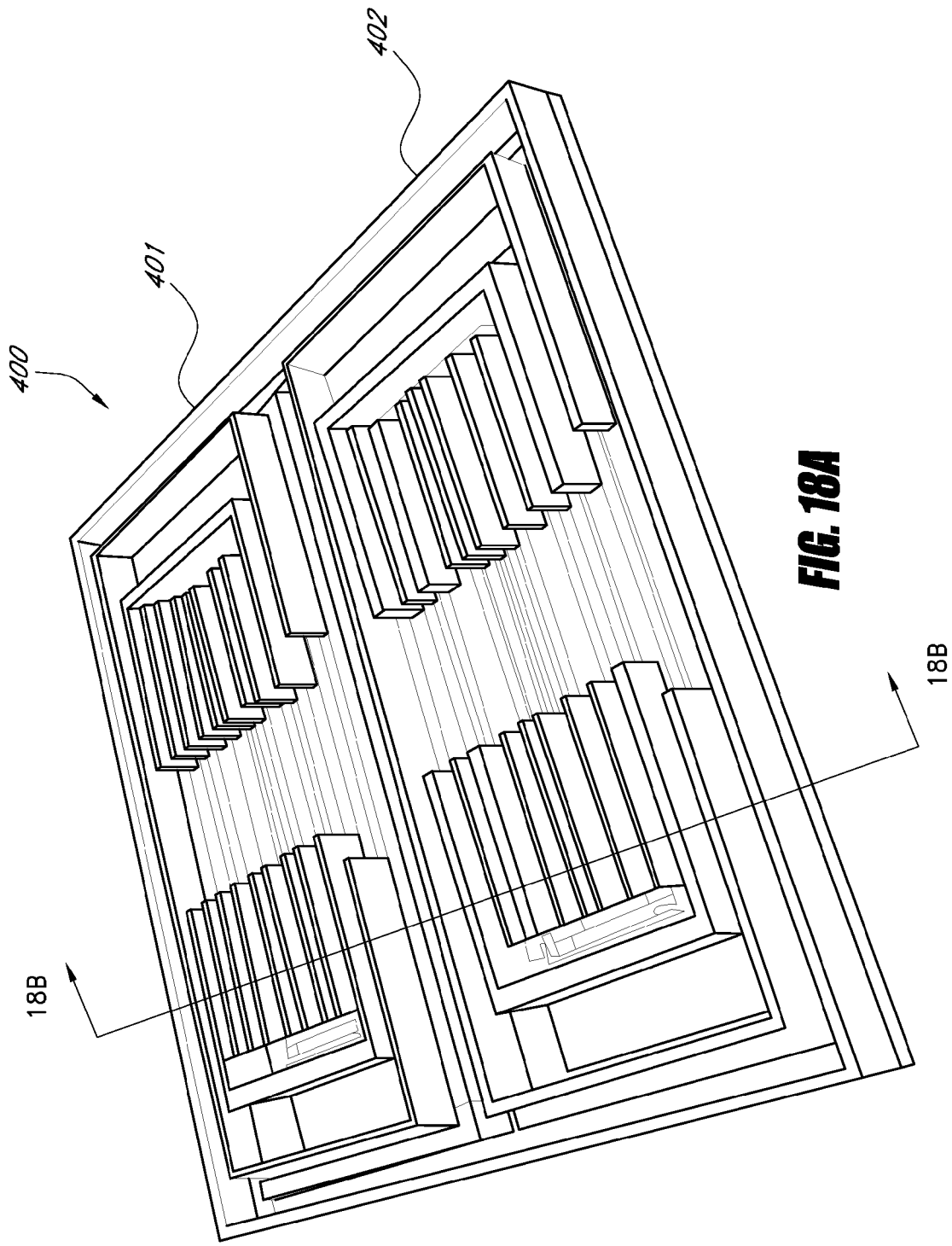

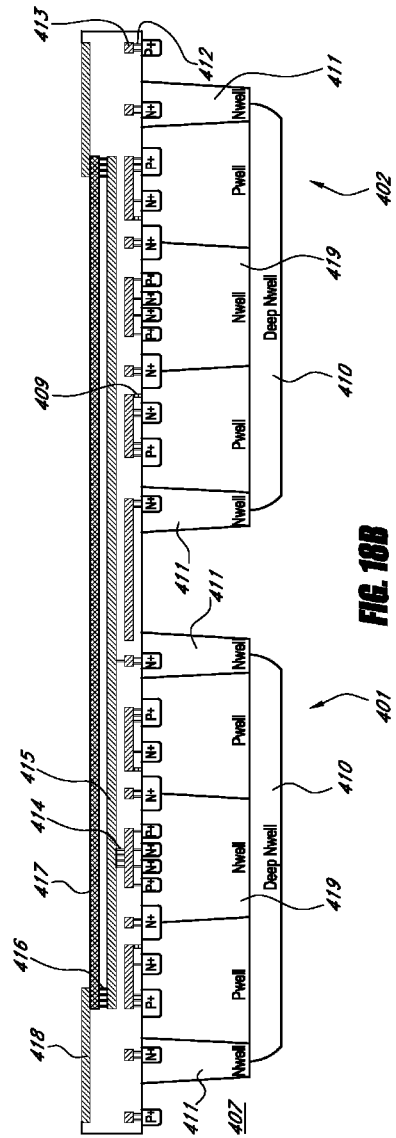

_US 8,928,085 B2_

APPARATUS AND METHOD FOR ELECTRONIC CIRCUIT PROTECTION

CROSS-REFERENCE TO RELATED APPLICATIONS

This application is a continuation of U.S. application Ser. No. 12/797,463, filed Jun. 9, 2010, entitled "APPARATUS AND METHOD FOR ELECTRONIC SYSTEMS RELIABILITY", the entire disclosure of which is hereby incorporated herein by reference. This application is also related to U.S. application Ser. No. 12/797,461, filed Jun. 9, 2010, entitled "APPARATUS AND METHOD FOR PROTECTING ELECTRONIC CIRCUITS", now U.S. Pat. No. 8,368,116, issued Feb. 5, 2013, the entire disclosure of which is hereby incorporated herein by reference.

BACKGROUND

1. Field

Embodiments of the invention relate to electronic systems, and more particularly, to protection circuits for electronic systems.

2. Description of the Related Technology

Certain electronic systems can be exposed to a transient signal event, or an electrical signal of a relatively short duration having rapidly changing voltage and high power. Transient signal events can include, for example, electrostatic discharge (ESD) events arising from the abrupt release of charge from an object or person to an electronic system.

Transient signal events can damage integrated circuits (ICs) inside an electronic system due to overvoltage conditions and/or high levels of power dissipation over relatively small areas of the ICs. High power dissipation can increase IC temperature, and can lead to numerous problems, such as gate oxide punch-through, junction damage, metal damage, and surface charge accumulation. Moreover, transient signal events can induce latch-up (in other words, inadvertent creation of a low-impedance path), thereby disrupting the functioning of the IC and potentially causing permanent damage to the IC. Thus, there is a need to provide an IC with protection from such transient signal events.

SUMMARY

In one embodiment, an apparatus for providing protection from transient electrical events comprises an integrated circuit, a pad on a surface of the integrated circuit, and a configurable protection circuit within the integrated circuit. The configurable protection circuit is electrically connected to the pad. Additionally, the configurable protection circuit comprises a plurality of subcircuits arranged in a cascade, and selection of one or more of the plurality of the subcircuits for operation determines at least one of a holding voltage or a trigger voltage of the configurable protection circuit.

In another embodiment, a method for providing protection from transient signals comprises providing an integrated circuit having a pad on a surface of the integrated circuit and having a configurable protection circuit comprising a plurality of subcircuits. The method further comprises selecting one or more of the plurality of the subcircuits for operation in a cascade, wherein selecting the one or more of the plurality of the subcircuits for operation determines at least one of a holding voltage or a trigger voltage of the configurable protection circuit.

BRIEF DESCRIPTION OF THE DRAWINGS

FIG. 4A is a schematic block diagram of a pad circuit in accordance with one embodiment.

FIG. 4B is a schematic block diagram of a pad circuit in accordance with another embodiment.

FIG. 17B is a cross section of the pad circuit of FIG. 17A taken along the line 17B-17B.

FIG. 18A is a perspective view of one implementation of the pad circuit of FIG. 11B.

FIG. 18B is a cross section of the pad circuit of FIG. 18A taken along the line 18B-18B.

DETAILED DESCRIPTION OF EMBODIMENTS

Figure 1:
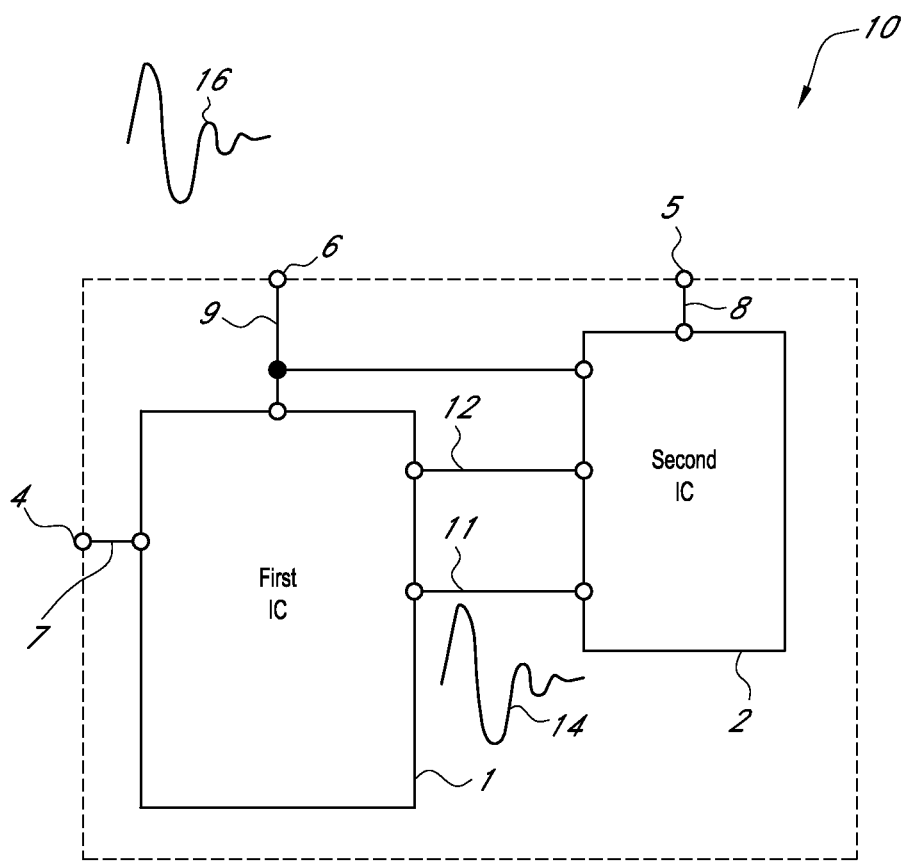
FIG. 1 is a schematic block diagram of one example of an electronic system including integrated circuits (ICs).

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Electronic systems are typically configured to protect circuits or components therein from transient signal events. Furthermore, to help assure that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide range of transient signal events, including ESD events.

Electronic circuit reliability can be improved by coupling pad protection circuits to the pads of an IC for transient signal protection. The pad circuits can be configured to maintain the voltage level at the pad within a predefined safe range. However, it can be difficult to provide pad circuits that meet reliability and performance requirements with low manufacturing cost and a relatively small circuit area.

An integrated circuit (IC) can have many pads, and different pads can be exposed to different voltage domains. Each voltage domain can have different performance and reliability requirements. For example, each voltage domain can have a different minimum operating voltage, maximum operating voltage, and constraint on leakage current. There is a need for providing IC protection pads operating over a multitude of voltage domains to enhance electronic circuit reliability for ICs in a simple and cost-effective manner.

Overview of Electronic Systems

FIG. 1 is a schematic block diagram of an electronic system 10, which can include one or more pad circuits according to an embodiment of the invention. The illustrated electronic system 10 includes a first IC 1, a second IC 2, and pins 4, 5, 6. As illustrated in FIG. 1, the pin 4 is electrically connected to the first IC 1 by a connection 7. The pin 5 is electrically connected to the second IC 2 by a connection 8. The electronic system 10 can also include pins electrically connected to both the first and second ICs 1, 2. For example, the illustrated pin 6 is electrically connected to the first and second ICs 1, 2 by a connection 9. Additionally, the first and second ICs 1, 2 can be electrically connected to one another by one or more connections internal to the electronic system 10, such as by connections 11 and 12. The first and second ICs 1, 2 can be exposed to user contact via, for example, the pins 4, 5, 6. The user contact can be through a relatively low-impedance connection.

The first and second ICs 1, 2 can be exposed to transient signal events, such as ESD events, which can cause IC damage and induce latch-up. For example, the connection 11 can receive a device-level transient signal event 14, and/or the pin 6 can receive a system-level transient signal event 16. The transient signal events 14, 16 can travel along the connections 11, 9, respectively, and can be received at the pads of the first and second ICs 1, 2.

In some embodiments, the first and second ICs 1, 2 can include pads, and can be provided with pad circuits configured to ensure reliability of the ICs by maintaining the voltage level at the pads within a selected range, which can vary from pad to pad. For example, either or both of the first and second ICs 1, 2 can include one or more pads configured to operate over a multitude of voltage domains or current bias conditions, each having varying performance and reliability requirements.

Overview of Power Management ICs

In some embodiments, one or more pad circuits can be employed in an IC, such as the first IC 1 of FIG. 1, and can be configured to provide transient signal protection to one or more internal circuits of the IC. The pad circuit can be configured to divert a current associated with a transient signal event received on a pad of the IC to other nodes or pads of the IC, thereby providing transient signal protection, as will be described in further detail below. The current can be shunted from, for example, a low-impedance output pad, a high-impedance input pad, or a low-impedance power or ground pad, to a low impedance pad or node of the IC. When no transient signal event is present, the pad circuit can remain in a high-impedance/low-leakage state, thereby reducing or minimizing static power dissipation resulting from leakage current and improving the operation of leakage sensitive circuitry, as will be described in detail below.

In other embodiments, one or more pad circuits can be provided in a single IC (for example, the first IC 1 of FIG. 1), and can be configured to provide transient signal protection for another component (for example, the second IC 2 of FIG. 1). The first IC 1 can be physically separated from the second IC 2, or it can be encapsulated in a common package with the second IC 2. In such embodiments, one or more pad circuits can be placed in a stand-alone IC, in a common package for system-on-a-package applications, or integrated with an IC in a common semiconductor substrate for system-on-a-chip applications.

Figure 2:
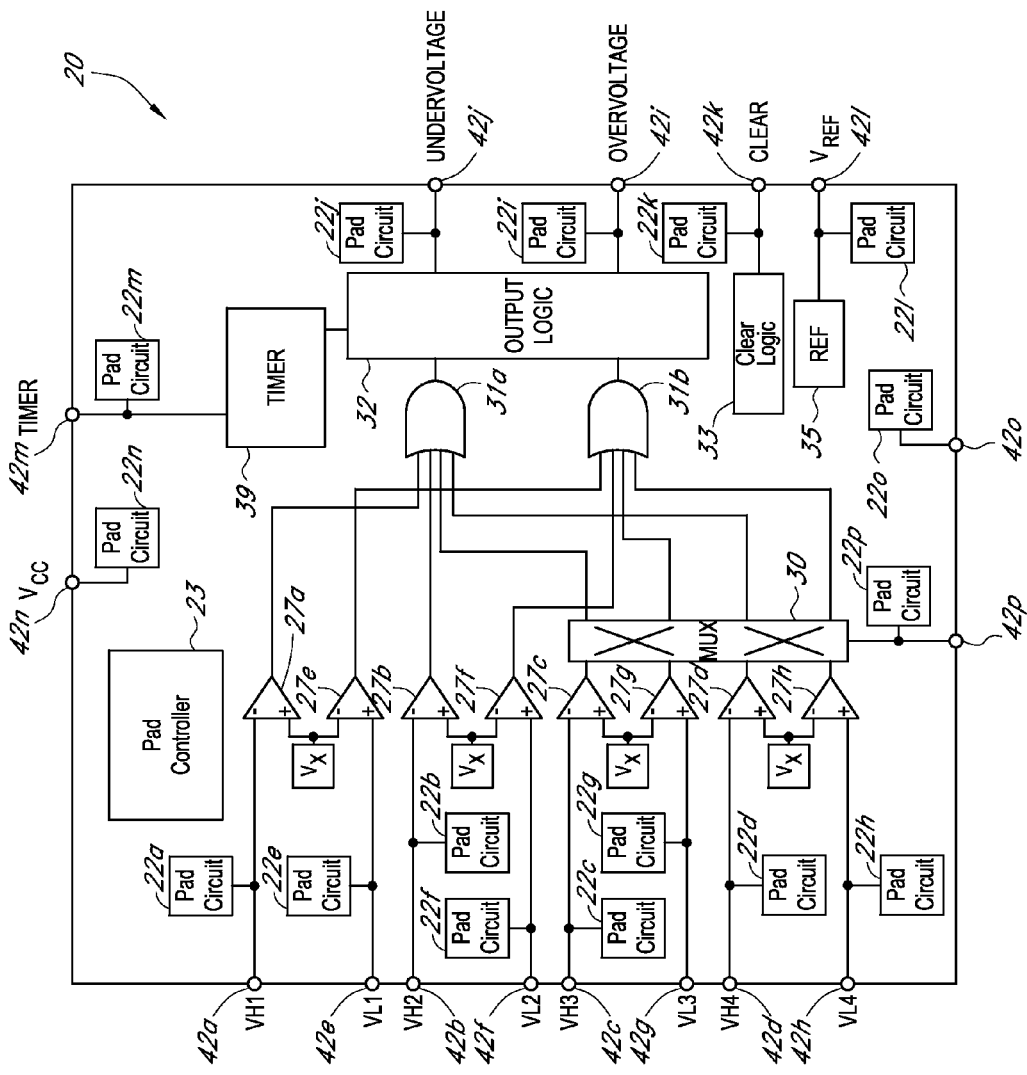
FIG. 2 is a schematic block diagram of an integrated circuit including pad circuits according to some embodiments.

FIG. 2 is a schematic block diagram of one example of an integrated circuit (IC) including pad circuits according to some embodiments. The IC 20 can be a power management IC, which can include, for example, pad circuits 22a-22p, a pad controller 23, comparators 27a-27h, a multiplexer 30, first and second OR gates 31a, 31b, an output logic 32, a clear logic 33, a voltage reference circuit 35, a timer 39, and pads 42a-42p. The power management IC 20 can be included in an electronic system, such as the electronic system 10 of FIG. 1, and can be, for example, the first IC 1 or the second IC 2. Depending on a design specification, not all of the illustrated components are necessary. For example, skilled artisans will appreciate that the pad controller 23 need not be included, that the power management IC 20 can be modified to monitor more or fewer voltage domains, and that the power management IC 20 can have more extensive or less extensive functionality.

Furthermore, although the pad circuits are illustrated in the context of the power management IC 20, the pad circuits can be employed in a wide array of ICs and other electronics having pads configured to operate over a multitude of voltage domains or current bias conditions.

The power management IC 20 can be configured to simultaneously monitor multiple voltage domains for overvoltage and undervoltage conditions, as will be described below. For example, the power management IC 20 can generate an overvoltage signal coupled to the pad 42*i* (OVERVOLTAGE), which can indicate whether or not an overvoltage condition is detected on any of the pads 42*a*-42*d* (VH1, VH2, VH3, and VH4, respectively). Additionally, the power management IC 20 can generate an undervoltage signal coupled to the pad 42*j* (UNDERVOLTAGE), which can indicate whether or not an undervoltage condition is detected on any of the pads 42*e*-42*h* (VL1, VL2, VL3, and VL4, respectively). Although the illustrated power management IC 20 is configured to monitor up to four voltage domains, skilled artisans will appreciate that this choice is merely illustrative, and that alternate embodiments of the power management IC 20 can be configured to be able to monitor more or fewer voltage domains, as well as to feature more extensive or less extensive functionality.

The power management IC 20 can aid in the integration and bias of ICs and other components of the electronic system 10. The power management IC 20 can also detect overvoltage conditions and/or undervoltage conditions which can endanger the proper operation of the electronic system 10. Additionally, the power management IC 20 can aid in reducing power consumption by detecting overvoltage conditions which can undesirably increase power consumption.

The power management IC 20 can be subject to stringent performance and design requirements. For example, the power management IC 20 can be subject to relatively tight constraints on leakage current in order to reduce static power dissipation and to improve performance for leakage-sensitive circuitry, as will be described below. Additionally, the power management IC 20 can be used to interact with multiple voltage domains, and thus should be able to handle relatively high input and output voltages without latching-up or sustaining physical damage. Moreover, there can be stringent requirements regarding the expense of the design and manufacture of the power management IC 20. Furthermore, in certain embodiments, configurability of the performance and design parameters of the power management IC 20 can be desirable, thereby permitting the power management IC 20 to be employed in a vast array of electronic systems and applications.

Each of the comparators 27*a*-27*h* can monitor an overvoltage or undervoltage condition of a voltage domain. This can be accomplished by providing a voltage from a voltage domain to a comparator. For example, a resistor divider (not shown in FIG. 2) having a series of resistors can be placed between a voltage supply of a voltage domain and a voltage reference, such as ground. A voltage can be tapped between the series of resistors and can be provided to a pad of the power management IC 20, such as, for example, the pad 42*a* (VH1). The voltage received at the pad 42*a* can be provided to the comparator 27*a*, which in turn can compare the voltage received from the pad 42*a* to a threshold voltage Vx. In one embodiment, the threshold voltage Vx is selected to be about 500 mV. By selecting the voltage provided to the pad 42*a* (for example, by selecting the number and magnitude of the resistors in the divider), the output of the comparator 27*a* can be configured to change when the voltage supply of a voltage domain exceeds a selected value. Likewise, by selecting the voltage provided to the pad 42*e* in a similar manner, the output of the comparator 27*e* can be configured to change when the supply of a voltage domain falls below a selected value.

As described above, the voltage provided to the pads 42*a*-42*h* can be provided from a resistor divider. The impedance of the resistors in the resistor divider can be relatively large (for example, tens of Mega-Ohms) so as to minimize system-level static power consumption. Thus, the accuracy of the resistor divider can be sensitive to the leakage of the pads 42*a*-42*h*, and there can be stringent performance requirements on the leakage current of the pads 42*a*-42*h*.

The first OR gate 31*a* can determine if one or more of the comparators coupled to its inputs indicate that an overvoltage condition has been detected. Likewise, the second OR gate 31*b* can determine if one or more of the comparators coupled to its inputs indicate that an undervoltage condition has been detected. In the illustrated embodiment, the outputs of comparators 27*a*, 27*b* are provided to the first OR gate 31*a*, while the outputs of the comparators 27*e*, 27*f* are provided to the second OR gate 31*b*.

Additionally, the first and second OR gates 31*a*, 31*b* can each receive signals from the multiplexer 30. The multiplexer 30 can allow overvoltage and undervoltage detection to be performed on voltage domains having a negative polarity with respect to the voltage received on the ground pad 42*o* (GND), such that overvoltage and undervoltage relate to magnitudes or absolute values of voltage. In particular, the multiplexer 30 can select which comparator signals are provided to the first and second OR gates 31*a*, 31*b* in response to a select control signal received from the pad 42*p* (SEL). For example, the multiplexer 30 can be configured to selectively provide the first OR gate 31*a* with the output of the comparator 27*c* or the comparator 27*g*, and the output of the comparator 27*d* or the comparator 27*h*, based on a state of the select control signal received from the pad 42*p* (SEL). Likewise, the multiplexer 30 can be configured to selectively provide the second OR gate 31*b* with the output of the comparator 27*c* or the comparator 27*g*, and the output of the comparator 27*d* or the comparator 27*h*, based on a state of the select control signal received from the pad 42*p* (SEL). By selecting which comparator outputs are provided to the first and second OR gates 31*a*, 31*b*, overvoltage and undervoltage detection can be performed on the voltages on the pads 42*c*, 42*d* and 42*g*, 42*h*, even for voltage domains having a negative polarity with respect to ground. The multiplexer 30 can be implemented with logic gates, with 3-state gates, or the like.

The output logic 32 can control the state of the pad 42*i* (OVERVOLTAGE) and the pad 42*j* (UNDERVOLTAGE). For example, the output logic 32 can indicate that an overvoltage or undervoltage condition has been detected based at least in part on the outputs of the first and second OR gates 31*a*, 31*b*. The output logic 32 can signal the detection of an overvoltage or undervoltage condition for a duration exceeding the time that the first or second OR gates 31*a*, 31*b* indicates that an overvoltage or undervoltage condition has been detected. For example, the output logic 32 can receive a signal from the timer 39, which can indicate the duration that the overvoltage or undervoltage condition should be asserted. The timer 39 can be electrically connected to the pad 42*m* (TIMER) and can be configured to have a drive strength and corresponding drive resistance. The pad 42*m* can be electrically connected to an external capacitor, which can have a variable capacitance to establish an RC time constant for determining the reset delay of the timer 39.

The output logic 32 can also be configured to communicate with the clear logic 33. The clear logic 33 can receive a clear control signal from pad 42*k* (CLEAR). In response to the clear control signal, the output logic 32 can reset the state of the pads 42*i* (OVERVOLTAGE) and 42*j* (UNDERVOLTAGE) to indicate that no overvoltage or undervoltage condition has been detected.

The power management IC 20 can also provide an output reference voltage on pad 42*l* ($V_{REF}$). This voltage can be selected to be, for example, about 1 V. The output voltage reference can be used by other components of the electronic system in which the power management IC 20 is implemented (for example, the electronic system 10 of FIG. 1). For example, the reference voltage can be provided as a reference voltage to one end of a resistor divider configured to provide a voltage to the pads 42a-42h for overvoltage or undervoltage detection.

As described above, the power management IC 20 can be configured to monitor multiple voltage domains, for example, four voltage domains for overvoltage and undervoltage conditions. Each of the voltage domains can have the same or different operating conditions and parameters. Additionally, the power management IC 20 can include a multitude of output pads, such as the pad 42i for indicating the detection of an overvoltage condition, the pad 42j for indicating the detection of an undervoltage condition, the pad 42p for providing the output voltage reference. The power management IC 20 can also include control pads, such as the pad 42p (SEL), the pad 42k (CLEAR), and the pad 42m (TIMER). Furthermore, the power management IC 20 can include the power pad 42n (Vcc) and the ground pad 42o (GND).

In some embodiments, the electronic system (for example, the electronic system 10 of FIG. 1) having the pads 42a-42p can have different requirements for minimum operating voltage, maximum operating voltage, and leakage current for each of the pads 42a-42p. Thus, each of the pads 42a-42p described above can have different performance and design requirements. In order to meet reliability requirements across a wide variety of applications, it can be desirable that one or more of the pads 42a-42p have a pad circuit configured to protect the power management IC 20 from overvoltage conditions and latch-up. Furthermore, it can be desirable that each pad circuit 22a-22p is configurable to operate with different reliability and performance parameters, for example, by changing only metal layers during back-end processing, or by using the pad controller 23 after fabrication. This can advantageously permit the pad circuits 22a-22p to be configurable for a particular application without requiring a redesign of the power management IC 20.

Figure 3A:
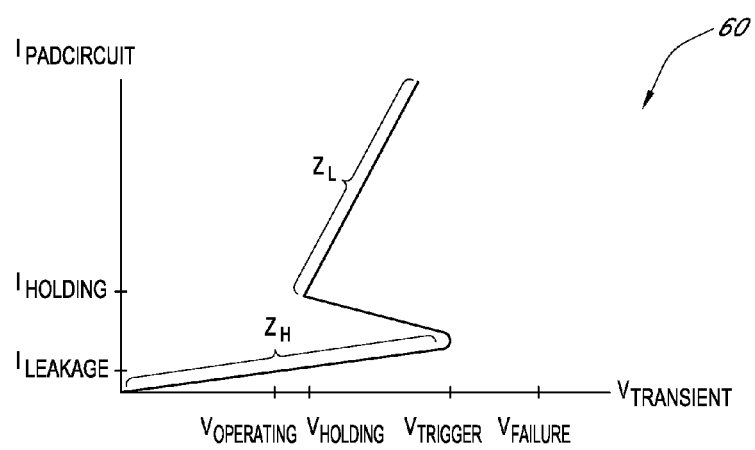
FIG. 3A is a graph of one example of pad circuit current versus transient signal voltage.

FIG. 3A illustrates a graph 60 of one example of pad circuit current versus transient signal voltage. As described above, it can be desirable for each pad circuit 42a-42p to be configured to maintain the voltage level at the pad within a predefined safe range. Thus, the pad circuit can shunt a large portion of the current associated with the transient signal event before the voltage of the transient signal $V_{TRANSIENT}$ reaches a voltage $V_{FAILURE}$ that can cause damage to the power management IC 20. Additionally, the pad circuit can conduct a relatively low current at the normal operating voltage $V_{OPERATING}$, thereby minimizing static power dissipation resulting from the leakage current $I_{LEAKAGE}$ and improving the performance of leakage sensitive circuitry, such a resistor divider.

Furthermore, as shown in the graph 60, the pad circuit can transition from a high-impedance state $Z_H$ to a low-impedance state $Z_L$ when the voltage of the transient signal $V_{TRANSIENT}$ reaches the voltage $V_{TRIGGER}$. Thereafter, the pad circuit can shunt a large current over a wide range of transient signal voltage levels. The pad circuit can remain in the low-impedance state $Z_L$ as long as the transient signal voltage level is above a holding voltage $V_{HOLDING}$ and the rate of voltage change is in the range of normal frequency operating conditions, rather than in the range of high frequency conditions and relatively fast rise and fall times which can be associated with a transient signal event. In certain embodiments, it can be desirable for the holding voltage $V_{HOLDING}$ to be above the operating voltage $V_{OPERATION}$ so that the pad circuit does not remain in the low-impedance state $Z_L$ after passage of the transient signal event and a return to normal operating voltage levels.

Figure 3B:
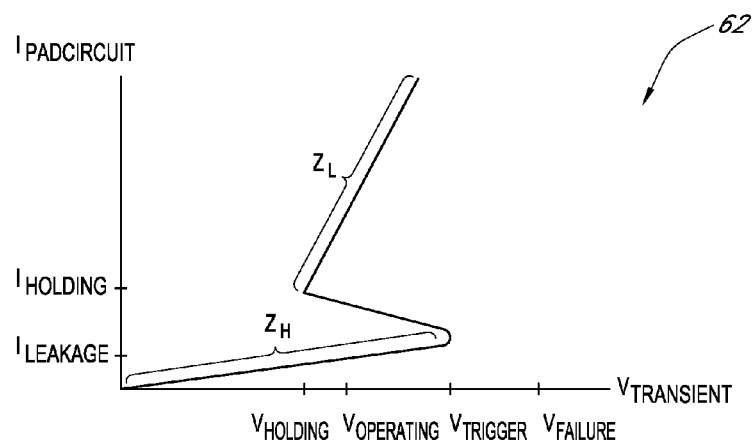
FIG. 3B is a graph of another example of pad circuit current versus transient signal voltage.

FIG. 3B is a graph 62 of another example of pad circuit current versus transient signal voltage. As shown in FIG. 3B, a pad circuit can transition from a high-impedance state $Z_H$ to a low-impedance state $Z_L$ when the voltage of the transient signal $V_{TRANSIENT}$ reaches the voltage $V_{TRIGGER}$. Thereafter, the pad circuit can shunt a large current over a wide range of transient signal voltage levels. The pad circuit can remain in the low-impedance state $Z_L$ as long as the transient signal voltage level is above a holding voltage $V_{HOLDING}$. It can be desirable for the holding voltage $V_{HOLDING}$ to be below the operating voltage $V_{OPERATION}$ in order to provide enhanced protection against transient signal events and to reduce the circuit area needed to provide a desired pad shunting current. This technique can be employed, for example, in embodiments in which the holding current $I_{HOLDING}$ exceeds the maximum current the pad can supply when biased at normal operating voltage levels. Thus, in certain embodiments, the pad circuit need not remain in the low-impedance state $Z_L$ after passage of the transient signal event and a return to normal operating voltage levels, even when $V_{OPERATION}$ exceeds $V_{HOLDING}$, because the pad may not be able to supply a sufficient holding current $I_{HOLDING}$ to retain the pad circuit in the low-impedance state $Z_L$.

As described above, the operating and reliability parameters of a pad circuit can vary widely, depending on a particular application. For purposes of illustration only, one particular electronic system can have the characteristics shown in Table 1 below for selected pads of FIG. 2.

TABLE 1

| Pad | $V_{OPERATION}$ | | $V_{HOLDING}$ | | $V_{TRIGGER}$ | | $I_{LEAKAGE}$ | |
|---|---|---|---|---|---|---|---|---|
| | Min | Max | Min | Max | Min | Max | Min | Max |
| VH1 | 0 V | 8 V | 9 V | 13 V | 16 V | 20 V | 0 nA | 15 nA |
| VH2 | 0 V | 8 V | 6 V | 10 V | 16 V | 20 V | 0 nA | 15 nA |
| VH3 | 0 V | 8 V | 3 V | 7 V | 16 V | 20 V | 0 nA | 15 nA |
| VH4 | 0 V | 16 V | 6 V | 10 V | 24 V | 30 V | 0 nA | 15 nA |
| Vcc | 18 V | 20 V | 22 V | 24 V | 24 V | 30 V | 0 nA | 10 nA |
| OVERVOLTAGE | 0 V | 16 V | 14 V | 18 V | 24 V | 30 V | 0 nA | 15 nA |
| UNDERVOLTAGE | 0 V | 16 V | 8 V | 12 V | 24 V | 30 V | 0 nA | 15 nA |

There is a need for pad circuits which can be configured to meet the performance and design parameters of an electronic circuit or IC (such as the power management IC 20 of FIG. 2) required for a particular application. Furthermore, in certain embodiments, there is a need for pad circuits which can operate with different reliability and performance parameters, for example, by changing only metal layers, or by configuring the power management IC 20 post-fabrication by selecting the setting of a pad controller 23. This can advantageously permit pad circuits 42a-42p to be configured for a particular application without requiring a redesign of the power management IC 20. The pad controller 23 can employ metal or poly fuses to control the operation of an ESD tolerant switch, as will be described in further detail below.

IC Pad Circuits for Protection from Transient Signal Event

FIG. 4A is a schematic block diagram of a pad circuit 22 according to an embodiment of the invention. The illustrated pad circuit 22 includes a first building block 72, a second building block 74, and a third building block 76. The first, second, and third building blocks 72, 74, 76 can be connected end-to-end in a cascade configuration between a pad 42 and a node 82, and can be subcircuits of the pad circuit 22. Additional or fewer building blocks can be included in the cascade to achieve the desired reliability and performance parameters, as will be described in further detail below. The pad circuit 22 can be, for example, any of the pad circuits 22a-22p shown in FIG. 2, and the pad 42 can be any of the pads 42a-42p, including, for example, low-impedance output pads, high-impedance input pads, and low-impedance power pads. The node 82 can be, for example, a low impedance node or pad of the power management IC 20 configured to handle a relatively large shunted current.

The building blocks 72, 74, 76 can form a pad circuit that has characteristics shown in FIG. 3A or 3B. In one embodiment, the first, second and third building blocks 72, 74, 76 can be selected from a variety of types, such as a variety of electrically isolated clamp structures, so as to achieve the desired performance and reliability parameters for the pad circuit 22. For example, a first type of building block (Type A) can have a holding voltage $V_{H\_A}$ and a trigger voltage $V_{T\_A}$. A second type of building block (Type B) can have, for example, a trigger voltage $V_{T\_B}$ and a holding voltage $V_{H\_B}$. By arranging additional or fewer of each type of building block, the overall holding voltage and trigger voltage of embodiments of the pad circuit 22 can be selectively varied. As will be described below, the building block types can be selected such that, when combining i number of Type A building blocks and j number of Type B building blocks in a cascade configuration, the pad circuit 22 can have a trigger voltage $V_{TRIGGER}$ roughly equal to about $i*V_{T\_A}+j*V_{T\_B}$, and a holding voltage $V_{HOLDING}$ roughly equal to about $i*V_{H\_A}+j*V_{H\_B}$. Thus, by selecting the type and/or number of building blocks employed after manufacturing, and/or selecting the value of $V_{H\_A}$, $V_{H\_B}$, $V_{T\_A}$ and $V_{T\_B}$ during design of the building blocks, a scalable family of pad circuit embodiments can be created which can be adapted for a multitude of electronic systems and applications.

The design cost associated with designing the pad circuits can be reduced as compared to, for example, an approach in which different diode, bipolar, silicon controlled rectifier, and/or MOS devices are employed to achieve the reliability and performance requirements needed for each pad circuit. Moreover, in one embodiment, a first building block is placed below the pad and additional building blocks are placed in the vicinity of the pad. During back-end fabrication (for example, fabrication of metal layers), building blocks can be included in a cascade configuration with the first building block. Thus, each pad circuit 22 can be configured for a particular electronic system or application by changing the metal layers to control the building block configuration, as will be described below.

FIG. 4B is a schematic block diagram of a pad circuit in accordance with one embodiment. The illustrated pad circuit 22 includes a first building block 72, a second building block 74, and a third building block 76. The first, second, and third building blocks 72, 74, 76 can be connected end-to-end in a cascade configuration between a pad 42 and a node 82. Additional or fewer building blocks and blocks of a variety of types can be included in the cascade, as described earlier in connection with FIG. 4A.

Additionally, as illustrated in FIG. 4B, the pad controller 23 can be configured to control the connections between the cascaded building blocks. For example, the pad controller 23 can be configured to bypass the second building block 74, thus selectively omitting the second building block 74 from the cascade. In one embodiment, a first building block is formed below the pad and additional building blocks are formed in the vicinity of the pad. After completing both front-end and back-end fabrication, particular building blocks can be included in a cascade with the first building block using the pad controller 23. For example, the pad controller 23 can be configured to include or exclude particular building blocks, thereby configuring the pad circuit 22 to have the trigger voltage $V_{TRIGGER}$ and holding voltage $V_{HOLDING}$ desired for a particular application. In one embodiment, each pad circuit 22 can be individually controlled by the pad controller 23 to achieve the desired cascade. In alternative embodiments, groupings of pads can be collectively configured by the pad controller 23. This can be desirable, for example, when a particular group of pads, such as VH1 and VL1 of FIG. 2, may have similar performance and reliability requirements.

In one embodiment, the pad controller 23 is configured to use metal or poly fuses to control the operation of an ESD tolerant switch. The switch can be configured to bypass the operation of particular building blocks in the pad circuit 22. In an alternate embodiment, the pad controller 23 can include a multitude of fuse-controlled filaments that can be independently biased to configure each pad circuit 22 per combinations of building block types, such as the building block types which will be described later with reference to FIGS. 5A-5C.

Although FIGS. 4A and 4B were described in the context of Type A and Type B building blocks, additional building block types can be used. For example, a Type C building block can have a holding voltage $V_{H\_C}$ and a trigger voltage $V_{T\_C}$ that are different from the holding voltages and the trigger voltages, respectively, of the first and second types of building blocks. The pad circuit 22 can combine i number of Type A building blocks, j number of Type B building blocks, and k number of Type C building blocks such that the pad circuit 22 has a trigger voltage $V_{TRIGGER}$ roughly equal to about $i*V_{T\_A}+j*V_{T\_B}+k*V_{T\_C}$, and a holding voltage $V_{HOLDING}$ roughly equal to about $i*V_{H\_A}+j*V_{H\_B} k*V_{H\_C}$. The inclusion of additional building block types can increase the multitude of configurations of the cascade at the expense of an increase in design complexity. Furthermore, the number of building blocks in the cascade can also be increased to provide additional configurations, provided that each building block remains properly biased at the increased trigger and holding voltages. For example, in an electrically isolated clamp embodiment in which a deep n-well layer provides electrical isolation between building blocks, the number of building blocks can be limited by the voltage level provided to the deep n-well to maintain electrical isolation.

Figure 5C:
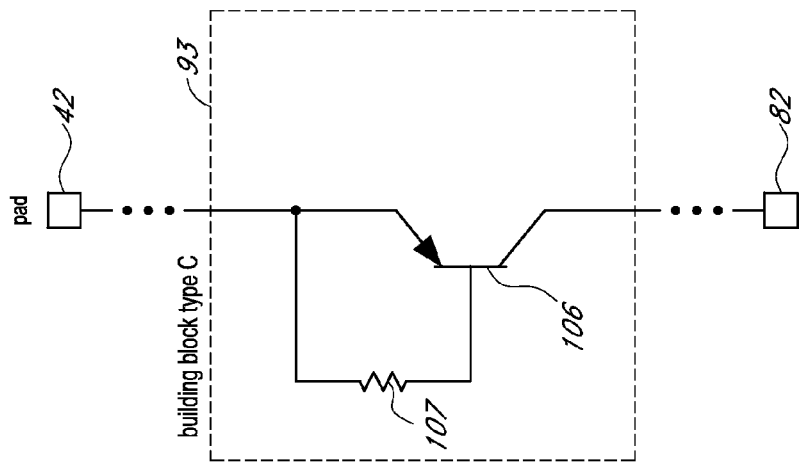
FIG. 5C is a circuit diagram illustrating a pad circuit building block in accordance with yet another embodiment.
Figure 5B:
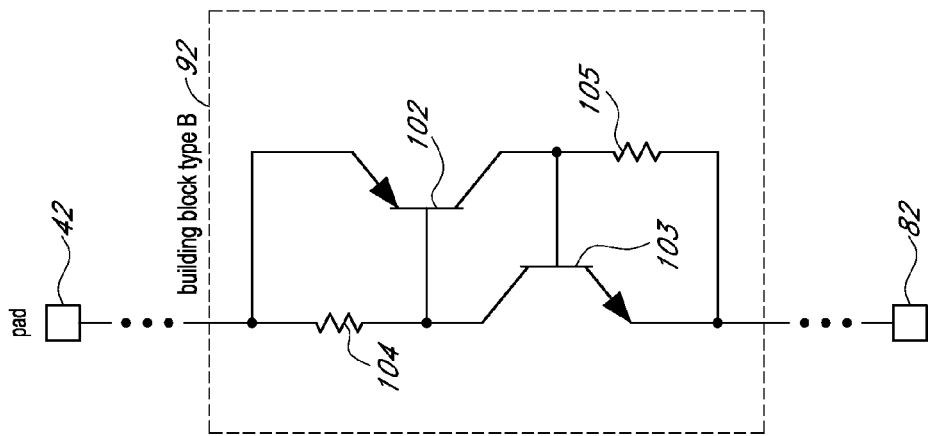
FIG. 5B is a circuit diagram illustrating a pad circuit building block in accordance with another embodiment.
Figure 5A:
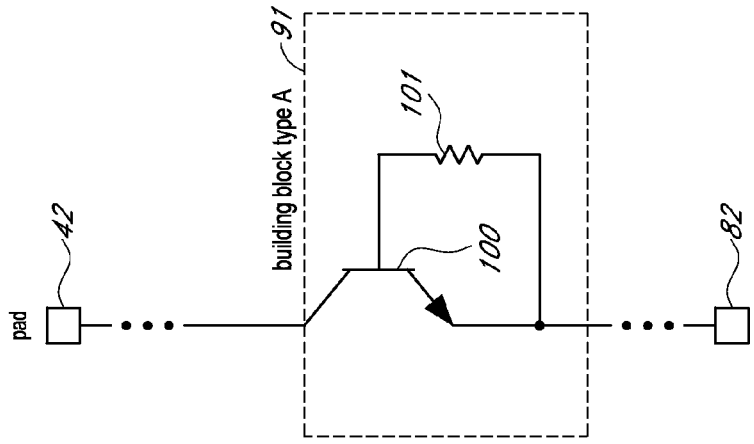
FIG. 5A is a circuit diagram illustrating a pad circuit building block in accordance with one embodiment.

FIGS. 5A-5C illustrate the circuits of a family of building block types, one or more of which can be employed as a building block type in the pad circuits of FIGS. 4A and 4B.

FIG. 5A is a circuit diagram illustrating a pad circuit building block (for example, the Type A building block described above in connection with FIGS. 4A and 4B) in accordance with one embodiment. The Type A building block 91 includes a resistor 101 and a NPN bipolar transistor 100 having an emitter, a base, and a collector. The resistor 101 includes a first end electrically connected to the base of the transistor 100, and a second end electrically connected to the emitter of the transistor 100. The resistor 101 can have, for example, a resistance between about 5Ω and about 55Ω. The collector of the transistor 100 can be electrically connected to another building block or to a pad 42. The emitter of the transistor 100 can be electrically connected to another building block or to a node 82.

FIG. 5B is a circuit diagram illustrating a pad circuit building block (for example, the Type B building block described above in connection with FIGS. 4A and 4B) in accordance with another embodiment. The Type B building block 92 includes a PNP bipolar transistor 102, an NPN bipolar transistor 103, a first resistor 104 and a second resistor 105. The PNP transistor 102 and the NPN transistor 103 each include an emitter, a base, and a collector. The first resistor 104 includes a first end electrically connected to the emitter of the PNP transistor 102, and a second end electrically connected to the base of the PNP transistor 102 and to the collector of the NPN transistor 103. The first resistor 104 can have, for example, a resistance between about 5Ω and about 35Ω. The second resistor 105 includes a first end electrically connected to the collector of the PNP transistor 102 and to the base of the NPN transistor 103, and a second end electrically connected to the emitter of the NPN transistor 103. The second resistor 105 can have, for example, a resistance between about 50Ω and about 250Ω. The emitter of the PNP transistor 102 can be electrically connected to another building block or to a pad 42. The emitter of the NPN transistor 103 can be connected to another building block or to a node 82.

As skilled artisans will appreciate, the PNP transistor 102 and NPN transistor 103 are configured to be in feedback. At a certain level of the collector current of the PNP transistor 102, the feedback between the PNP transistor 102 and the NPN transistor 103 can be regenerative and can cause the Type B building block 92 to enter a low-impedance state.

FIG. 5C is a circuit diagram illustrating a pad circuit building block (for example, the Type C building block described above in connection with FIGS. 4A-4B) in accordance with yet another embodiment. The Type C building block 93 includes a resistor 107 and a PNP bipolar transistor 106 having an emitter, a base, and a collector. A first end of the resistor 107 is electrically connected to the emitter of the transistor 106, and a second end is electrically connected to the base of the transistor 106. The resistor 107 can have, for example, a resistance between about 11Ω and about 85Ω. The emitter of the transistor 106 can be electrically connected to another building block or to a pad 42. The collector of the transistor 106 can be connected to another building block or to a node 82.

With reference to FIGS. 5A-5C, the trigger and holding voltages of the Type A, Type B, and Type C building blocks can be selected so as to aid in configuring the pad circuit 22 to have a trigger voltage $V_{TRIGGER}$ and a holding voltage $V_{HOLDING}$ desired for a particular electronic system or application. For example, the trigger voltage of the Type A building block $V_{T\_A}$ and the trigger voltage of the Type B building block $V_{T\_B}$ can be based on the collector-emitter breakdown voltage of the NPN transistor 100 and the NPN transistor 103, respectively. Additionally, the positive feedback between the NPN transistor 103 and the PNP transistor 102 in Type B Building block 92 can make the holding voltage $V_{H\_B}$ of the Type B building block 92 less than the holding voltage $V_{H\_A}$ of the Type A building block 91. Furthermore, the Type C building block can have a holding voltage $V_{H\_C}$ greater than either the holding voltage $V_{H\_A}$ or $V_{H\_B}$, and can have a trigger voltage $V_{T\_C}$ based on the collector-emitter breakdown voltage of the PNP transistor 106.

In one embodiment, the Type A building block 91 and the Type B building block 92 are configured to have about the same trigger voltage, $V_{T\_A}=V_{T\_B}=V_T$. Additionally, the positive feedback between the NPN transistor 103 and the PNP transistor 102 is employed to selectively decrease the holding voltage $V_{H\_B}$ of the Type B building block 92 relative to the holding voltage $V_{H\_A}$ of the Type A building block. Thus, in some embodiments, i number of Type A building blocks and j number of Type B building blocks can be combined in a cascade configuration to produce a pad circuit 22 having a trigger voltage $V_{TRIGGER}$ roughly equal to about $(i+j)*V_T$, and a holding voltage $V_{HOLDING}$ roughly equal to about $i*V_{H\_A}j*V_{H\_B}$, where $V_{H\_B}$ is selected to be less than $V_{H\_A}$. This permits configurations having the same number of building blocks in the cascade to have about the same trigger voltage $V_{TRIGGER}$. Additionally, the type of building blocks in the cascade can be selected to achieve the desired holding voltage $V_{HOLDING}$ of the pad circuit 22.

Skilled artisans will appreciate that the desired trigger voltage and holding voltage of each building block type can be achieved by proper selection of a variety of parameters, including, for example, the geometries of the transistors, the common-emitter gain or "β" of the transistors, and by selecting the resistance of the resistors.

Bipolar Transistor Structures for Pad Circuits

Figure 6A:
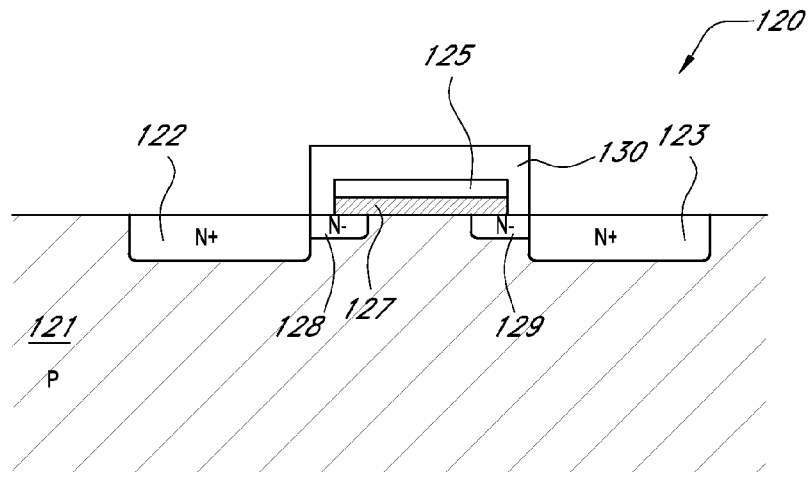
FIG. 6A is a cross section of a conventional NMOS transistor having a lightly doped drain (LDD) structure.
Figure 6B:
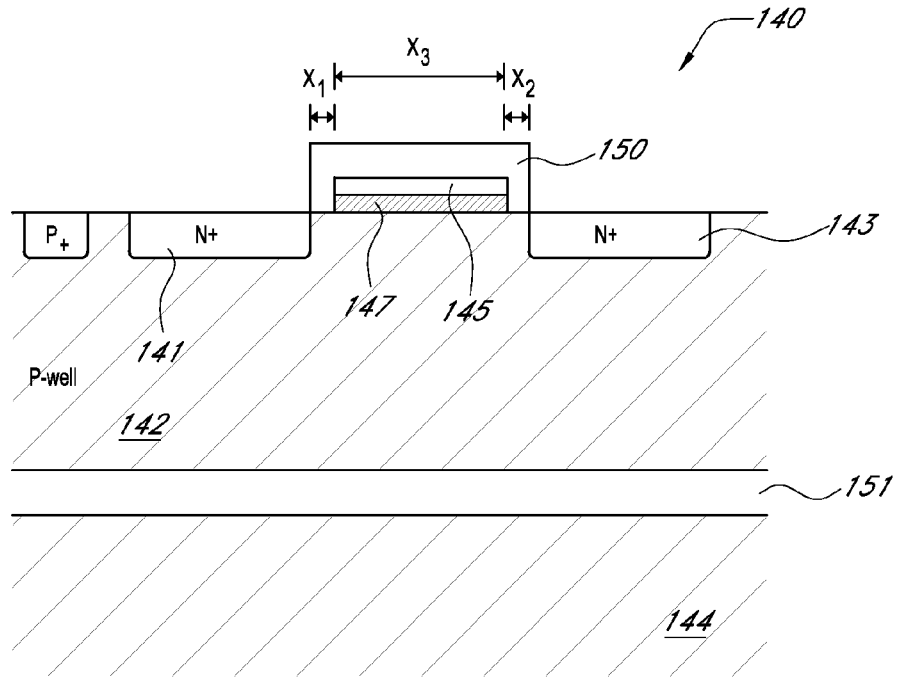
FIG. 6B is a cross section of an NPN bipolar transistor in accordance with one embodiment.
Figure 6C:
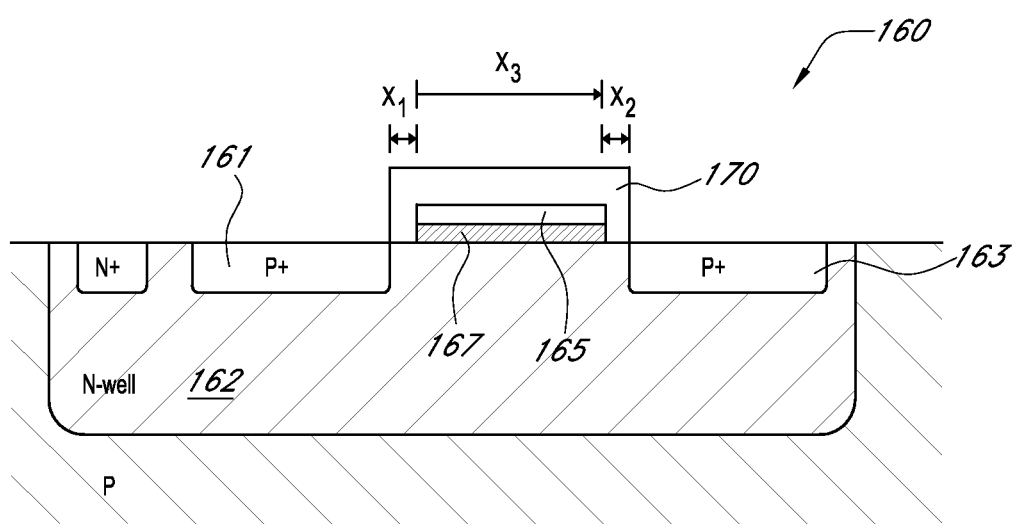
FIG. 6C is a cross section of a PNP bipolar transistor in accordance with another embodiment.

FIGS. 6A-6C illustrate cross sections of various transistor structures. As will be described below, FIGS. 6B and 6C illustrate cross sections of transistor structures according to embodiments of the invention. These transistors can be used in pad circuit building blocks, even in processes lacking dedicated bipolar transistor masks.

FIG. 6A illustrates a cross section of a conventional NMOS transistor having a lightly doped drain (LDD) structure. The LDD NMOS transistor 120 is formed on a substrate 121 and includes an n+ drain region 122, an n+ source region 123, a gate 125, gate oxide 127, a lightly doped (n−) drain extension region 128, a lightly doped source extension region 129, and sidewall spacers 130.

The n+ drain region 122 can be more heavily doped than the n− drain extension region 128. The difference in doping can reduce the electric fields near the drain region, thereby improving the speed and reliability of the transistor 120 while lowering gate-drain capacitance and minimizing the injection of hot electrons into the gate 125. Likewise, the n+ source region 123 can be more heavily doped than the n− source extension region 129 and provide similar improvements to the transistor 120.

In a conventional LDD process, the gate electrode 125 is used as a mask for n− LDD implantation used to form the drain and source extension regions 128, 129. Thereafter, sidewall spacers 130 can be provided and employed as a mask for n+ implantation used to form the drain region 122 and the source region 123.

FIG. 6B illustrates a cross section of a parasitic NPN bipolar transistor in accordance with one embodiment. The illustrated parasitic NPN bipolar transistor 140 includes an emitter 141, a base 142 formed of a p-well, a collector 143, a plate 145, an oxide layer 147, an isolation layer 151, and sidewall spacers 150. The emitter 141, the collector 143, the plate 145, and the oxide layer 147 have structures similar to those of the drain region 122, the source region 123, the gate 125, and the oxide layer 127, respectively, of the conventional NMOS transistor 120 of FIG. 6A. In contrast to the LDD NMOS transistor 120 shown in FIG. 6A, the illustrated bipolar transistor 140 does not have structures similar to those of the source and drain extension regions of the NMOS transistor 120.

Removal of the source and drain extension regions can result in transistor conduction being dominated by a bipolar component, rather than by a FET component. In particular, when a voltage is applied to the plate 145, the inversion layer may not extend from the emitter 141 to the collector 143, and thus the FET component of the current can be weak. Thus, during an overvoltage condition, the parasitic NPN bipolar transistor 140 can serve as the primary conduction path, and the parasitic NPN bipolar transistor 140 can function similarly to a traditional bipolar transistor.

The resulting structure can have lower leakage than a conventional NMOS structure and withstand relatively large voltages without breakdown. Further, the resulting structure can be sized so as to employ the parasitic bipolar structure for transient signal protection without drawbacks, such as reduced reliability, typically encountered in high performance analog applications when degrading the standard MOS device characteristics. Since the parasitic NPN bipolar transistor 140 can be formed using a process used to create a conventional LDD MOS transistor, such as the NMOS transistor 120 of FIG. 6A, both the parasitic NPN bipolar transistor 140 and the LDD NMOS transistor 120 can be fabricated simultaneously on a common substrate.

The parasitic bipolar transistor 140 can have desirable properties for ESD protection and can be used in building blocks described above in connection with FIGS. 5A-5B. The use of the parasitic NPN bipolar transistor 140 can be desirable, for example, in a process which includes conventional LDD MOS transistors, but which lacks a dedicated bipolar process. In one embodiment, a single additional mask can be added during fabrication of transistors to determine which transistor structures receive the LDD implant and which do not.

The sidewall spacers 150 can be formed using, for example, an oxide, such as $SiO_2$, or a nitride. However, other sidewall spacer materials can be utilized in certain manufacturing processes. A distance $x_1$ between the emitter 141 and the plate 145 can be selected to be, for example, in a range of about 0.1 µm to 2.0 µm. A distance $x_2$ between the collector 143 and the plate 145 can be selected to be, for example, in a range of about 0.1 µm to 2.0 µm.

The plate 145 can be formed from a variety of materials, including, for example, doped or undoped polysilicon. Although the plate 145 is illustrated as a single layer, the plate 145 can include multiple layers, such as, for example, layers of polysilicon and silicide. In one embodiment, the plate 145 can have a plate length $x_3$ selected to be in a range of about 0.25 µm to about 0.6 µm, for example, about 0.5 µm. However, skilled artisans will appreciate that the length of the plate 145 can vary depending on the particular process and application. The plate 145 can be formed over the oxide layer 147, which can correspond to, for example, any oxide layer dielectric known in the art or any oxide layer dielectric later discovered, including high-k oxide layers.

The emitter 141 and the collector 143 of the bipolar transistor 140 can be formed using a variety of materials, including for example, any n-type doping material. The spacing between the emitter 141 and the collector 143 can correspond to the sum of the distance x1, the distance x2, and the plate length x3. In one embodiment, the spacing between the emitter 141 and collector 143 is selected to be in the range of about 0.45 µm to about 4.6 µm. The doping between the emitter and the collector, both beneath the sidewall spacers 151 and the plate can consist essentially of n-type, which can result in transistor conduction being dominated by a bipolar component, rather than by a FET component. Thus, when a voltage is applied to the plate 145, the inversion layer may not extend from the emitter 141 to the collector 143, and thus the FET component of the current can be weak. Accordingly, during an overvoltage condition, the parasitic NPN bipolar transistor 140 can serve as the primary conduction path, and the parasitic NPN bipolar transistor 140 can function similarly to a traditional bipolar transistor.

The base 142 can be electrically isolated from the substrate 144 using a wide variety of techniques. In the illustrated embodiment, the isolation layer 151 is a deep n-well layer provided to electrically isolate the base 142 from the substrate 144. Persons of ordinary skill in the art will appreciate that a variety of techniques to provide electrical isolation are well known in the art and can be used in accordance with the teachings herein. For example, the isolation layer 151 can be an n-type buried layer or an isolation layer of a silicon-on-insulator (SOI) technology. The parasitic bipolar transistor 140 can undergo back end processing to form, for example, contacts and metallization. Skilled artisans will appreciate that various processes can be used for such back end processing.

FIG. 6C is a cross section of a PNP bipolar transistor 160 in accordance with one embodiment. The illustrated PNP bipolar transistor 160 includes an emitter 161, a base 162 formed of an n-well, a collector 163, a plate 165, an oxide layer 167, and sidewall spacers 170. The PNP bipolar transistor 160 can be formed in a manner similar to that of the NPN bipolar transistor 140 by selecting impurities with opposite polarity to that described above.

The parasitic NPN bipolar transistor 140 and the parasitic PNP bipolar transistor 160 can be formed by omitting the implantation of the LDD layer in a conventional MOS process. As will be described in detail below, the NPN bipolar transistor 140 and the PNP bipolar transistor 160 can be used in the building blocks of FIGS. 5A-5C, thereby permitting the fabrication of a family of pad circuit building blocks even with a process lacking dedicated bipolar masks. The building blocks can be cascaded to achieve the desired holding and trigger voltages for a pad circuit, such as the pad circuit 22 of FIGS. 4A and 4B.

Alternative Embodiments of IC Pad Circuits

FIGS. 7A-8B represent building block types, one or more of which can be employed as a building block type in the pad circuits of FIGS. 4A and 4B.

Figure 7A:
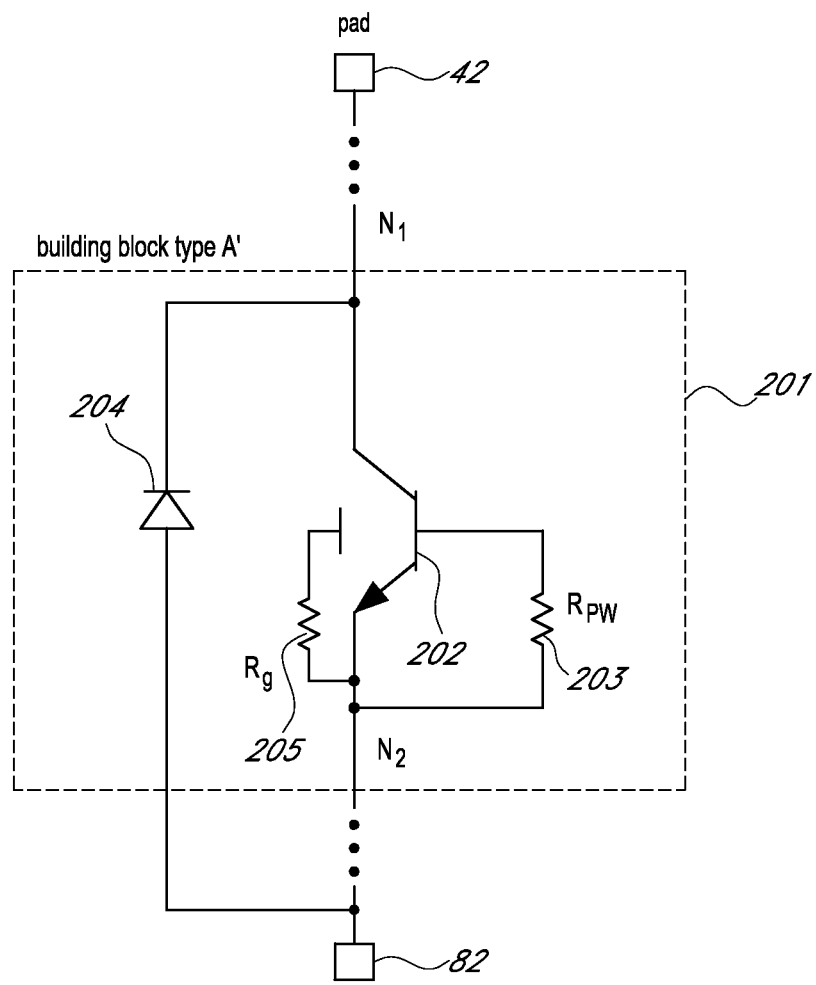
FIG. 7A is a circuit diagram illustrating a pad circuit building block in accordance with yet another embodiment.

FIG. 7A is a circuit diagram illustrating a pad circuit building block in accordance with yet another embodiment. The illustrated Type A' building block 201 can be connected in a cascade between a pad 42 and a node 82, and includes a first resistor 203, a second resistor 205, a diode 204, and a NPN bipolar transistor 202 having an emitter, a base, a collector, and a plate. The NPN bipolar transistor 202 can have the structure of the NPN bipolar transistor 140 of FIG. 6B.

The diode 204 includes an anode electrically connected to the node 82, and a cathode electrically connected to the collector of the NPN bipolar transistor 202 at a node $N_1$. The node $N_1$ can be electrically connected to another building block in a cascade, such as the cascade of FIG. 4A, or to the pad 42. The first resistor 203 includes a first end electrically connected to the base of the NPN bipolar transistor 202, and a second end electrically connected to the emitter of the NPN bipolar transistor 202 and to a first end of the second resistor 205 at a node $N_2$. The first resistor 203 can have, for example, a resistance between about 5Ω and about 55Ω. In one embodiment, described below with reference to FIG. 7B, the first resistor 203 is implemented using a multi-finger array to achieve the target resistance, such as an array of six fingers each having a resistance selected from the range of about 30Ω and about 320Ω. The node $N_2$ can be electrically connected to another building block in a cascade or to the node 82. The second resistor 205 includes a second end electrically connected to the plate of the NPN bipolar transistor 202. The second resistor 205 can have, for example, a resistance between about 50Ω and about 50 kΩ.

As was described before with reference to FIGS. 4A and 4B, the pad circuit 22 can be employed in, for example, any of the pad circuits 22a-22p shown in FIG. 2, and the pad 42 can be any of the pads 42a-42p, including, for example, low-impedance output pads, high-impedance input pads, and low-impedance power pads. The node 82 can be, for example, a low impedance node or pad of the power management IC 20 configured to handle a relatively large shunted current. A transient signal event can be received at the pad 42. If the transient signal event has a voltage which is negative with respect to the node 82, the diode 204 can provide current which can aid in protecting the power management IC 20.

If the transient signal event has a voltage that is positive with respect to the node 82, the NPN bipolar transistor 202 can aid in providing transient signal protection. The trigger voltage of the Type A' building block $V_{T\_A'}$ can be based on the collector-emitter breakdown voltage of the NPN bipolar transistor 202. Additionally, the plate and the collector of the NPN bipolar transistor 202 can function to form a capacitor, which can enhance how the NPN bipolar transistor 202 performs when a transient signal event having a positive voltage is received by increasing the displacement current, as will be described below.

If the transient signal event received on pad 42 causes the node $N_1$ to have a rate of change $dV_{N1}/dt$ and the capacitance between the plate and the collector of the NPN bipolar transistor 202 has a value of $C_{202}$, a displacement current can be injected by the capacitor equal to about $C_{202}*dV_{N1}/dt$. A portion of this current can be injected in the base of the NPN bipolar transistor 202, which can increase the speed at which the Type A' building block 201 provides transient signal protection. As described above, a transient signal event can be associated with fast rise and fall times (for example, from about 0.1 ns to about 1.0 ms) relative to the range of normal signal operating conditions. Thus, the NPN bipolar transistor 202 can be configured to have a trigger voltage which decreases in response to rates of voltage change associated with the very high frequency conditions of a transient signal event. During normal operation, the absence of the lightly doped drain (LDD) can make the leakage of the NPN bipolar transistor 202 relatively low, even over a relatively wide range of temperatures, for example, between about −40° C. and about 140° C.

Figure 7B:
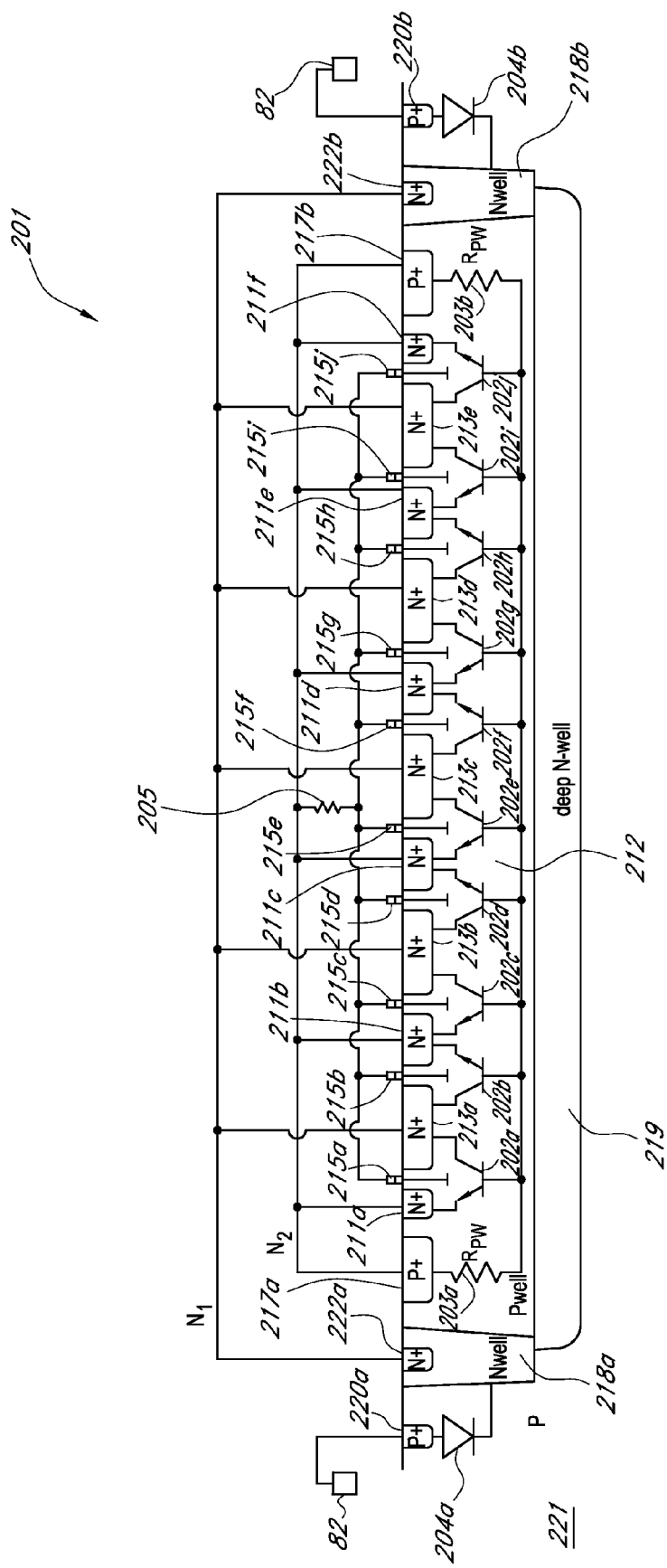
FIG. 7B is a cross section of one implementation of the pad circuit building block of FIG. 7A.

FIG. 7B illustrates an annotated cross section of one implementation of the pad circuit building block of FIG. 7A. The illustrated Type A' building block 201 includes a substrate 221, emitters 211a-211f, base 212, collectors 213a-213e, plates 215a-215j, base contacts 217a, 217b, n-wells 218a, 218b, deep n-well 219, and substrate contacts 220a, 220b. The cross section has been annotated to illustrate examples of circuit devices formed, such as parasitic NPN bipolar transistors 202a-202j, resistors 203a, 203b, and diodes 204a, 204b. The diagram is also annotated to show the second resistor 205, which can be formed using, for example, n-diffusion or poly (not shown in this Figure). The Type A' building block 201 can undergo back end processing to form contacts and metallization. These details have been omitted from FIG. 7B for clarity.

The diodes 204a, 204b can be formed from the substrate 221 and n-wells 218a, 218b. For example, the diode 204a has an anode formed from the substrate 221 and a cathode formed from the n-well 218a. Similarly, the diode 204b has an anode formed from the substrate 221 and a cathode formed from the n-well 218b.

The NPN bipolar transistors 202a-202j can be formed from emitters 211a-211f, collectors 213a-213e, plates 215a-215j, and base 212. For example, the NPN bipolar transistor 202a can be formed from the emitter 211a, the plate 215a, the collector 213a, and the base 212. The NPN bipolar transistors 202b-202j can be formed in a similar manner from emitters 211b-211f, collectors 213a-213e, plates 215b-215j, and base 212. Additional details of the NPN bipolar transistors 202a-202j can be as described above with reference to FIG. 6B.

The base 212 can be electrically isolated from the substrate 221 using n-wells 218a, 218b and deep n-well 219. The n-wells 218a, 218b and deep n-well 219 can also provide electrically isolation of the building block from other building blocks. The n-well contacts 222a, 222b can form a guard ring around the Type A' building block 201. The n-well contacts 222a, 222b can be contacted to a metal layer above by using multiple rows of contacts, thereby permitting the guard ring to be connected to the collectors 213a-213e through metal. The guard ring can eliminate the formation of unintended parasitic paths between the pad circuit and surrounding semiconductor components when integrated on-chip. Additionally, the substrate contacts 220a, 220b can form a substrate ring which can aid in protecting the Type A' building block 201 from latch-up.

The resistors 203a, 203b can be formed from the resistance between the bases of NPN bipolar transistors 202a-202j and the base contacts 217a, 217b. The resistance along the paths between the bases of the NPN bipolar transistors 202a-202j and the base contacts 217a, 217b can be modeled by the resistors 203a, 203b.

Persons of ordinary skill in the art will appreciate that the cross-section shown in FIG. 7B can result in the formation of the circuit shown in FIG. 7A. For example, each of the emitters of the NPN bipolar transistors 202a-202j can be electrically connected together to form a common emitter. Likewise, each of the collectors, plates, and bases of the NPN bipolar transistors 202a-202j can be electrically connected together to form a common collector, a common plate, and a common base, respectively. Thus, each of the NPN bipolar transistors 202a-202j can be legs of the NPN bipolar transistor 202. Additionally, the diodes 204a, 204b can be represented by the diode 204, and the resistors 203a, 203b can be represented by the first resistor 203. The second resistor 205 can be formed using, for example, n-diffusion or poly (not shown in this Figure). Thus, FIG. 7B illustrates a cross section of an implementation of the pad circuit building block of FIG. 7A. Skilled artisans will appreciate that numerous layout implementations of the Type A' building block 201 are possible.

As described earlier with reference to FIG. 7A, the capacitance between the plate and the collector of the NPN bipolar transistor 202 can result in a current which can be injected in the base of the NPN bipolar transistor 202. This can increase the speed at which the Type A' building block 201 provides transient signal protection. The second resistor 205 can have a resistance selected to provide injection into the base of the NPN bipolar transistors at a frequency associated with a transient signal event. In one embodiment, the second resistor 205 can have a resistance in the range of about 200Ω to 50 kΩs.

Each of the NPN bipolar transistors 202a-202j can be legs of the NPN bipolar transistor 202 as described above. In one embodiment, each of the NPN bipolar transistors has a plate width (for example, the width of the plate 145 in a direction orthogonal to the plate length $x_3$ of FIG. 6B) between about 30 μm and 100 μm, so that the total plate width (the sum of the plates widths of all legs) is in the range of about 300 μm to 1,000 μm. In one embodiment, the plate length of each NPN bipolar transistors (for example, $x_3$ in FIG. 6B) is selected to be between about 0.25 μm and about 0.6 μm, for example, about 0.5 μm. Although the cross section shown in FIG. 7B illustrates the NPN bipolar transistor 202 as having ten legs, skilled artisans will appreciate that more or fewer legs can be selected depending on, for example, the desired dimensions of the pad circuit and the desired total plate width. In one embodiment described with reference to FIGS. 17A-17H, the number and width of the legs are selected so that the implementation of the Type A' building block 201 can fit under a bonding pad.

Figure 8A:
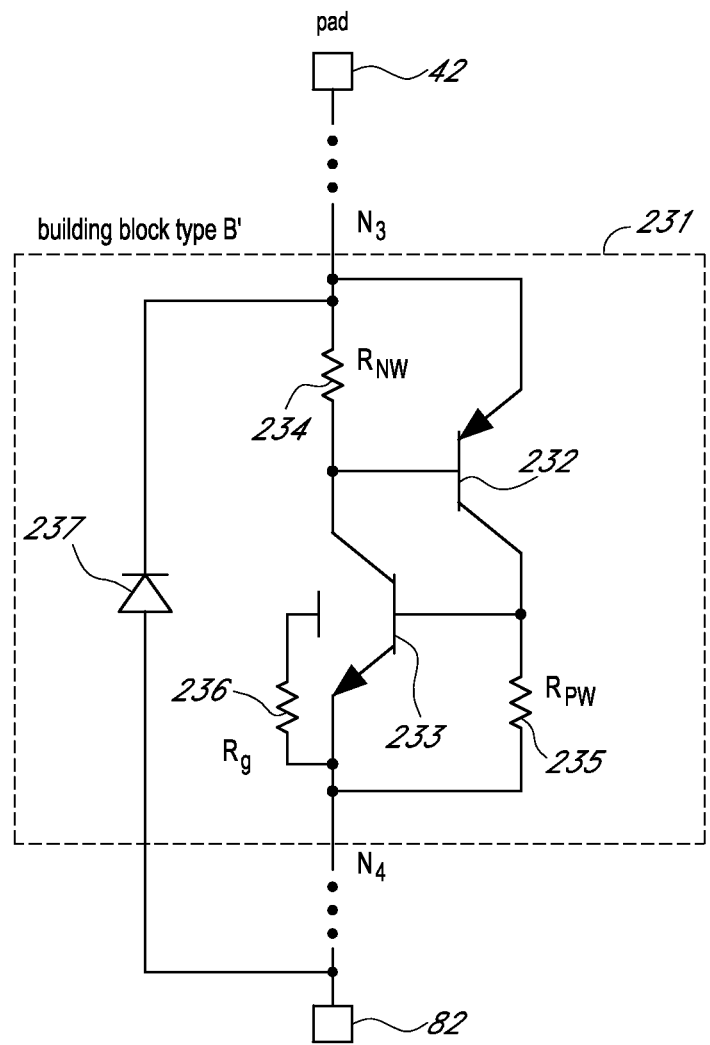
FIG. 8A is a circuit diagram illustrating a pad circuit building block in accordance with yet another embodiment.

FIG. 8A is a circuit diagram illustrating a pad circuit building block in accordance with yet another embodiment. The illustrated Type B' building block 231 can be connected in a cascade between the pad 42 and the node 82, and includes a PNP transistor 232, a NPN bipolar transistor 233, a first resistor 234, a second resistor 235, a third resistor 236, and a diode 237. The PNP transistor 232 includes an emitter, a base, and a collector. The NPN bipolar transistor 233 includes an emitter, a base, a collector and a plate, and can have a structure similar to that of the NPN bipolar transistor 140 of FIG. 6B.

The diode 237 includes an anode electrically connected to the node 82, and a cathode electrically connected to a first end of the first resistor 234 and to the emitter of the PNP transistor 232 at a node $N_3$. The node $N_3$ can be electrically connected to another building block in a cascade, such as the cascade of FIG. 4A, or to the pad 42. The first resistor 234 also includes a second end electrically connected to the base of the PNP transistor 232 and to the collector of the NPN bipolar transistor 233. The first resistor 234 can have, for example, a resistance between about 5Ω and about 35Ω. In one embodiment, described below with reference to FIG. 8B, the first resistor 234 is implemented using a multi-finger array to achieve the target resistance, such as an array of two fingers each having a resistance selected from the range of about 10Ω and about 70Ω. The second resistor 235 includes a first end electrically connected to the collector of the PNP transistor 232 and to the base of the NPN bipolar transistor 233, and a second end electrically connected to the emitter of the NPN bipolar transistor 233 and to a first end of the third resistor 236 at a node $N_4$. The second resistor 235 can have, for example, a resistance between about 50Ω and about 250Ω. In one embodiment, described below with reference to FIG. 8B, the second resistor 235 is implemented using a multi-finger array to achieve the target resistance, such as an array of two fingers each having a resistance selected from the range of about 100Ω and about 500Ω. The node $N_4$ can be electrically connected to another building block in a cascade or to the node 82. The third resistor 236 includes a second end electrically connected to the plate of the NPN bipolar transistor 233. The third resistor 236 can have, for example, a resistance between about 200Ω and about 50 kΩ.

As was described before with reference to FIGS. 4A and 4B, the pad circuit 22 can be, for example, any of the pad circuits 22a-22p shown in FIG. 2, and the pad 42 can be any of the pads 42a-42p. The node 82 can be, for example, a low impedance node or pad of the power management IC 20 configured to handle a relatively large shunted current. A transient signal event can be received at the pad 42. If the transient signal event has a voltage that is negative with respect to the node 82, the diode 237 can provide current which can aid in protecting the power management IC 20.

If the transient signal event has a voltage which is positive with respect to the node 82, the PNP transistor 232 and the NPN bipolar transistor 233 can aid in providing transient signal protection. The trigger voltage of the Type B' building block $V_{T\_B'}$ can be based on the collector-emitter breakdown voltage of the NPN bipolar transistor 233. Additionally, the positive feedback between the NPN bipolar transistor 233 and the PNP transistor 232 can make the holding voltage $V_{T\_B'}$ of the Type B' building block 231 less than the holding voltage $V_{H\_A'}$ of the Type A' building block 201 of FIG. 7A.

The plate and the collector of the NPN bipolar transistor 233 can function to form a capacitor which can enhance the performance of the NPN bipolar transistor 233 when a transient signal event having a positive voltage is received, as was described earlier. For example, a portion of this current can be injected in the base of the NPN bipolar transistor 233 through capacitive coupling, which can aid the speed at which the Type B' building block 231 provides transient signal protection. Thus, the NPN bipolar transistor 233 can be configured to have a trigger voltage which is lower at rates of voltage change associated with the very high frequency conditions of a transient signal event. During normal operation, the absence of the lightly doped drain (LDD) can make the leakage of the NPN bipolar transistor 233 low, even at relatively high temperatures.

Figure 8B:
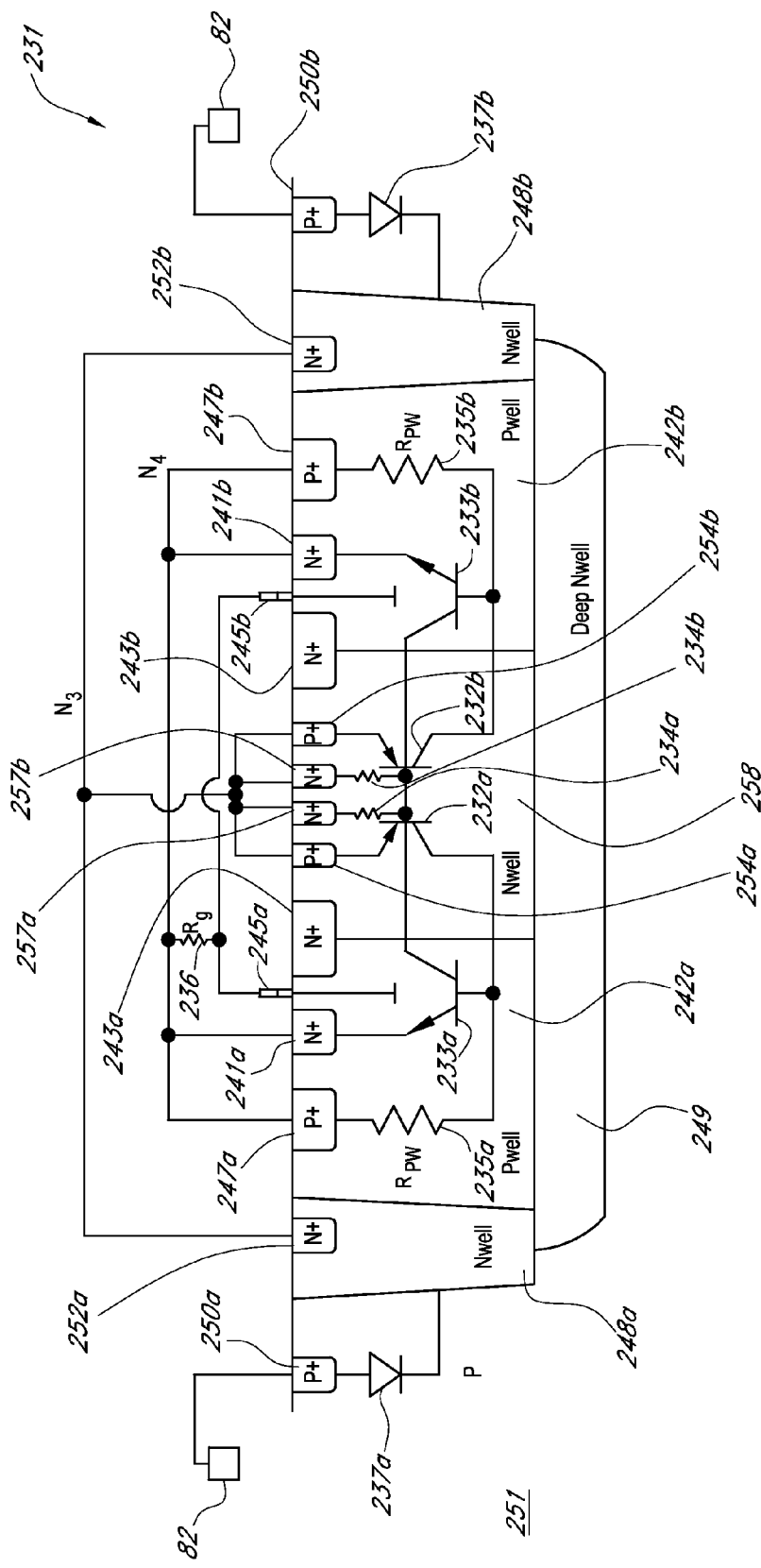
FIG. 8B is a cross section of one implementation of the pad circuit building block of FIG. 8A.

FIG. 8B is an annotated cross section of one implementation of the pad circuit building block of FIG. 8A. The illustrated Type B' building block 231 includes NPN emitters 241a, 241b, NPN bases 242a, 242b, NPN collector contacts 243a, 243b, plates 245a, 245b, NPN base contacts 247a, 247b, PNP base 258, PNP base contacts 257a, 257b, n-wells 248a, 248b, deep n-well 249, and substrate contacts 250a, 250b. As illustrated, the NPN collector contacts 243a, 243b are each formed partially in a p-well and partially in an n-well. For example, the NPN collector contact 243a is partially formed in the NPN base 242a, and partially formed in the PNP base 258, and the NPN collector contact 243b is partially formed in the NPN base 242b and partially formed in the PNP base 258. The cross section has been annotated to show certain circuit components formed from the layout, including NPN bipolar transistors 233a, 233b, PNP transistors 232a, 232b, p-well resistors 235a, 235b, n-well resistors 234a, 234b, and diodes 237a, 237b. The diagram is also annotated to show the third resistor 236, which can be formed using, for example, n-diffusion (not shown in this Figure). The Type B' building block 231 can undergo back end processing to form contacts and metallization. These details have been omitted from FIG. 8B for clarity.

The diodes 237a, 237b can be formed from substrate 251 and n-wells 248a, 248b. For example, the diode 237a has an anode formed from the substrate 251 and a cathode formed from the n-well 248a. The diode 237b has an anode formed from the substrate 251 and a cathode formed from the n-well 248b.

The NPN bipolar transistors 233a, 233b can be formed from NPN emitters 241a, 241b, PNP base 258, NPN collector contacts 243a, 243b, plates 245a, 245b, and NPN bases 242a, 242b. For example, the NPN bipolar transistor 233a can be formed from the NPN emitter 241a, the plate 245a, the PNP base 258, the NPN collector contact 243a, and the NPN base 242a. Likewise, the NPN bipolar transistor 233b can be formed from the NPN emitter 241b, the plate 245b, the PNP base 258, the NPN collector contact 243b, and the NPN base 242b. Although the NPN bipolar transistors 233a, 233b are connected to NPN collector contacts 243a, 243b, in the illustrated embodiment, the contacts 243a, 243b are not connected to metal layers, and thus the PNP base 258 can also serve as the collectors for NPN bipolar transistors 233a, 233b. Additional details of the NPN bipolar transistors 233a, 233b can be found above with reference to FIG. 6B.

The NPN bases 242a, 242b can be electrically isolated using n-wells 248a, 248b, n-well of the PNP base 258, and deep n-well 249. The n-well contacts 252a, 252b can form part of a guard ring around the Type B' building block 231. The substrate contacts 250a, 250b can form a portion of a substrate ring which can aid in protecting the Type B' building block 231 from latch-up.

The p-well resistors 235a, 235b can be formed from the resistance between the bases of NPN bipolar transistors 233a, 233b and the base contacts 247a, 247b. Skilled artisans will appreciate that the p-wells of the bases 242a, 242b can have a resistivity along the electrical path between the bases of NPN bipolar transistors 233a, 233b and the base contacts 247a, 247b, which can be modeled by p-well resistors 235a, 235b.

The PNP transistors 232a, 232b can be formed from PNP emitters 254a, 254b, PNP base 258, and the NPN bases 242a, 242b. For example, the PNP transistor 232a can have an emitter formed from the PNP emitter 254a, a base formed from the PNP base 258, and a collector formed from the NPN base 242a. Likewise, the PNP transistor 232b can have an emitter formed from the PNP emitter 254b, a base formed from the PNP base 258, and a collector formed from the NPN base 242b.

The n-well resistors 234a, 234b can be formed from the resistance between the bases of PNP transistors 232a, 232b and the PNP base contacts 257a, 257b. Skilled artisans will appreciate that the n-well of the PNP base 258 can have a resistivity along the electrical path between the bases of PNP transistors 232a, 232b and the PNP base contacts 257a, 257b, which can be modeled by n-well resistors 234a, 234b.

Persons of ordinary skill in the art will appreciate that the cross-section shown in FIG. 8B can result in the formation of the circuit shown in FIG. 8A. For example, each of the NPN bipolar transistors 233a, 233b can be legs of the NPN bipolar transistor 233. Likewise, each of the PNP transistors 232a, 232b can be legs of the PNP transistor 232. Additionally, the diodes 237a, 237b can form the diode 237, the n-well resistors 234a, 234b can form the first resistor 234, and the p-well resistors 235a, 235b can form the second resistor 235. The third resistor 236 can be formed using, for example, n-diffusion or poly (not shown in this Figure). Thus, FIG. 8B is a cross section of one implementation of the of the pad circuit building block of FIG. 8A. Skilled artisans will appreciate that numerous variations of the Type B' building block 201 are possible.

As was described above with reference to FIG. 8A, when a transient signal is present, the capacitance between the plate and the collector of the NPN bipolar transistor 233 can result in a current being injected in the base of the NPN bipolar transistor 233. This can aid the speed at which the Type B' building block 231 provides transient signal protection. The third resistor 236 can have a resistance selected to provide injection into the base of the NPN bipolar transistor 233 at a frequency associated with a particular transient signal event. In one embodiment, the third resistor 236 has a resistance selected in the range of about 200Ω to 50 kΩs.

Each of the NPN bipolar transistors 233a, 233b can be legs of the NPN bipolar transistor 233. In one embodiment, each NPN bipolar transistor 233a, 233b has a plate width typically selected between about 30 μm and 50 μm, so that the total plate width of the NPN bipolar transistor 233 is in the range of about 60 μm to 100 μm. The length of each NPN bipolar transistor 233a, 233b can have a length selected between, for example, about 0.25 μm and 0.6 μm, for example, about 0.5 μm. Although the cross section in FIG. 8B shows the NPN bipolar transistor 233 as having two legs, skilled artisans will appreciate that additional or fewer legs can be selected depending on a variety of factors, including the desired pad circuit dimensions and the desired total plate width. In one embodiment described with reference to FIGS. 18A-18B, the number and width of the legs is selected so that two instantiations of the Type B' building block 231 can fit under a bonding pad.

The PNP transistors 232a, 232b can be legs of the PNP transistor 232. Although the cross section illustrated in FIG. 8B shows the PNP transistor 232 as having two legs, skilled artisans will appreciate that additional or fewer legs can be selected depending on a variety of factors such as the manufacturing process and application.

With reference to FIGS. 4A, 4B, 7A, and 8A, the trigger voltages $V_{T\_A'}$, $V_{T\_B'}$ and the holding voltages $V_{H\_A'}$, $V_{H\_B'}$ of the Type A' and Type B' building blocks can be selected so that the pad circuit 22 has a trigger voltage $V_{TRIGGER}$ and a holding voltage $V_{HOLDING}$ desired for a particular electronic system or application. For example, i number of Type A' building blocks and j number of Type B' building blocks can be cascaded so that the pad circuit 22 has a trigger voltage $V_{TRIGGER}$ roughly equal to about $i*V_{T\_A'}+j*V_{T\_B'}$, and a holding voltage $V_{HOLDING}$ roughly equal to about $i*V_{H\_A'}+j*V_{H\_B'}$. By selecting the Type and number of building blocks employed, and/or by selecting the value of $V_{H\_A'}$, $V_{H\_B'}$, $V_{T\_A'}$ and $V_{T\_B'}$ during design of the building blocks, a scalable family of pad circuits can be created which can be adapted for a multitude of electronic systems and applications. The design cost associated with designing the pad circuits can be reduced as compared to, for example, an approach in which different diode, bipolar, silicon controlled rectifier and MOS devices are employed to achieve the reliability and performance requirements needed for each pad circuit. The desired trigger voltage and holding voltage of each building block type can be achieved by proper selection of a variety of parameters, including, for example, the geometries of the transistors, the common-emitter gain or "β" of the transistors, and by selecting the resistance of the resistors.

In one embodiment, the Type A' building block 201 and the Type B' building block 231 are configured to have about the same trigger voltage, $V_{T\_A'}=V_{T\_B'}=V_{T'}$. Additionally, the positive feedback between the NPN bipolar transistor 233 and the PNP transistor 232 is employed to selectively decrease the holding voltage $V_{H\_B'}$ of the Type B' building block 231 relative to the holding voltage $V_{H\_A'}$ of the Type A' building block 201. Thus, i number of Type A' building blocks and j number of Type B' building blocks can be combined in a cascade configuration to produce a pad circuit 22 having a trigger voltage $V_{TRIGGER}$ roughly equal to about $(i+j)*V_{T'}$, and a holding voltage $V_{HOLDING}$ roughly equal to about $i*V_{H\_A'}+j*V_{H\_B'}$, where $V_{H\_B'}$ is selected to be less than $V_{H\_A'}$. This permits configurations having the same number of building blocks in the cascade to have about the same trigger voltage $V_{TRIGGER}$. Additionally, the type of building blocks in the cascade can be selected to achieve the desired holding voltage $V_{HOLDING}$ of the pad circuit 22.

FIGS. 9A-14B illustrate various other embodiments in a family of cascaded building blocks using Type A' building block 201 and Type B' building block 231. Although FIGS. 9A-14B are described in the context of Type A' and Type B' building blocks 201, 231 of FIGS. 7A and 8A, skilled artisans will appreciate that similar configurations can be created using the Type A and Type B building blocks 91, 92 of FIGS. 5A and 5B.

As was described earlier with reference to Table 1 and FIGS. 3A and 3B, there is a need for pad circuits which can be configured to meet the performance and design parameters required for a particular application. For example, various pads of the power management IC 20 can have different reliability and performance parameters, as shown in Table 1. FIGS. 9A-14B illustrate various cascade configurations of Type A' and Type B' building blocks 201, 231, which can be employed to meet different reliability and performance parameters, as will be described below. In one embodiment, the type and number of building blocks are selected during design for a particular application. In another embodiment, a multitude of building blocks are placed in the vicinity of the pad during front end fabrication, and the desired configuration is selected by changing metal layers and via connections during back end processing. In yet another embodiment, a multitude of building blocks are placed in the vicinity of the bonding pad, and the type and number of the building blocks are selected using the pad controller 23 after fabrication, as was described earlier.

Figure 9A:
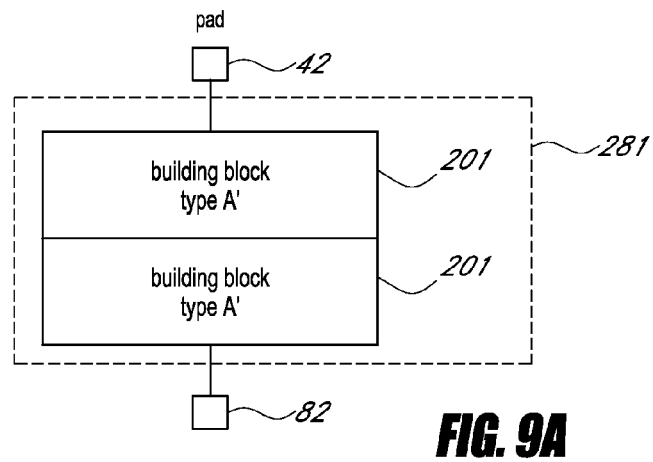
FIG. 9A is a schematic block diagram of a pad circuit according to a first embodiment.

FIG. 9A is a schematic block diagram of a pad circuit according to a first embodiment. The illustrated pad circuit 281 includes two Type A' building blocks 201 connected in a cascade between the pad 42 and the node 82. The Type A' building block 201 can be configured to have a trigger voltage $V_{T\_A'}$ equal to about the trigger voltage $V_{T\_B'}$ of the Type B' building block 231 of FIG. 8A. However, the holding voltage $V_{H\_A'}$ of the Type A' building block 201 can be configured to be greater than the holding voltage $V_{H\_B'}$ of the Type B' building block 231. Thus, the pad circuit 281 can be employed, for example, in an input pad having a moderate operating voltage and requiring a relatively high holding voltage. For example, if $V_{T\_A'}$ is equal to about 9 V and $V_{H\_A'}$ is equal to about 5 V, the pad circuit 281 can have a trigger voltage of about 18 V and a holding voltage of about 10 V. Thus, the pad circuit 281 can have a holding voltage and trigger voltage appropriate for the pad VH1 in Table 1.

Figure 9B:
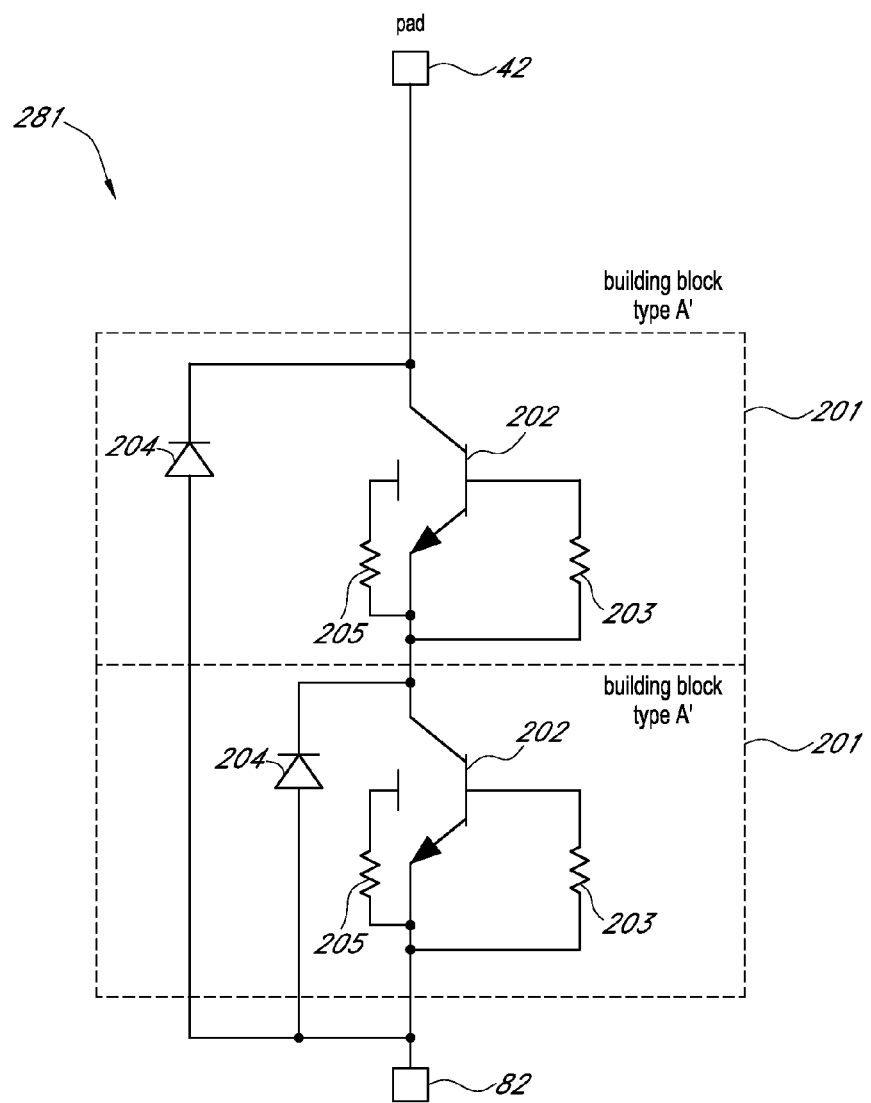
FIG. 9B is a circuit diagram of the pad circuit of FIG. 9A.

FIG. 9B is a circuit diagram of the pad circuit of FIG. 9A. The illustrated pad circuit 281 includes two Type A' building blocks connected in a cascade configuration between the pad 42 and the node 82. Each Type A' building block 201 includes a first resistor 203, a second resistor 205, a diode 204, and a NPN bipolar transistor 202 having an emitter, a base, a collector, and a plate. Additional details of the Type A' building block 201 can be as described earlier with reference to FIG. 7A.

Figure 10A:
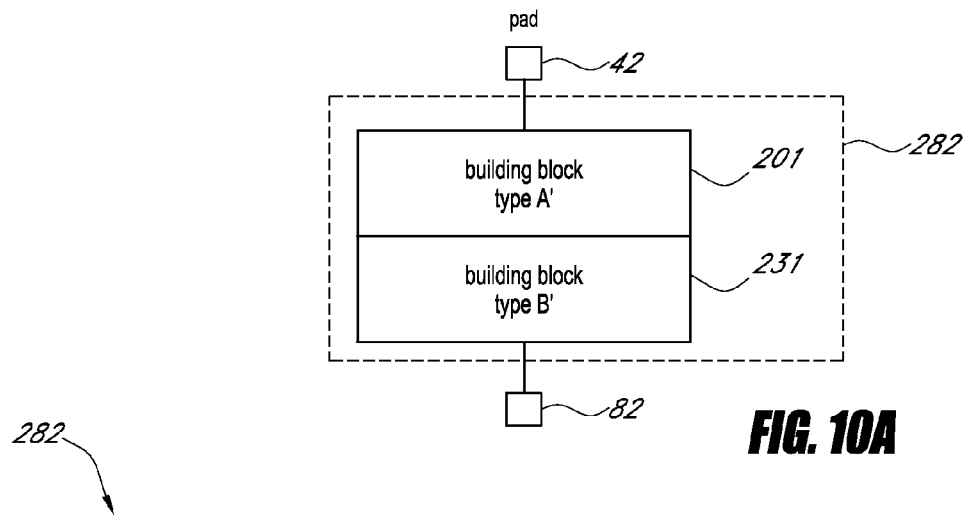
FIG. 10A is a schematic block diagram of a pad circuit according to a second embodiment.

FIG. 10A is a schematic block diagram of a pad circuit according to a second embodiment. The illustrated pad circuit 282 includes a Type A' building block 201 connected in a cascade with a Type B' building block 231 between the pad 42 and the node 82. As described above, the Type A' building block 201 can be configured to have a trigger voltage $V_{T\_A'}$ equal to about the trigger voltage $V_{T\_B'}$ of the Type B' building block 231. However, the holding voltage $V_{H\_A'}$ of the Type A' building block 201 can be configured to be greater than the holding voltage $V_{H\_B'}$ of the Type B' building block 231. Thus, the pad circuit 282 can be employed, for example, in an input pad having a relatively moderate operating voltage and requiring a relatively moderate holding voltage. For example, if $V_{T\_A'}$ and $V_{T\_B'}$ are equal to about 9 V, $V_{H\_A'}$ is equal to about 5 V, and $V_{H\_B'}$ is equal to about 2.5 V, the pad circuit 282 can have a trigger voltage of about 18 V and a holding voltage of about 7.5 V. Thus, the pad circuit 282 can have a holding voltage and trigger voltage appropriate for the pad VH2 in Table 1.

Figure 10B:
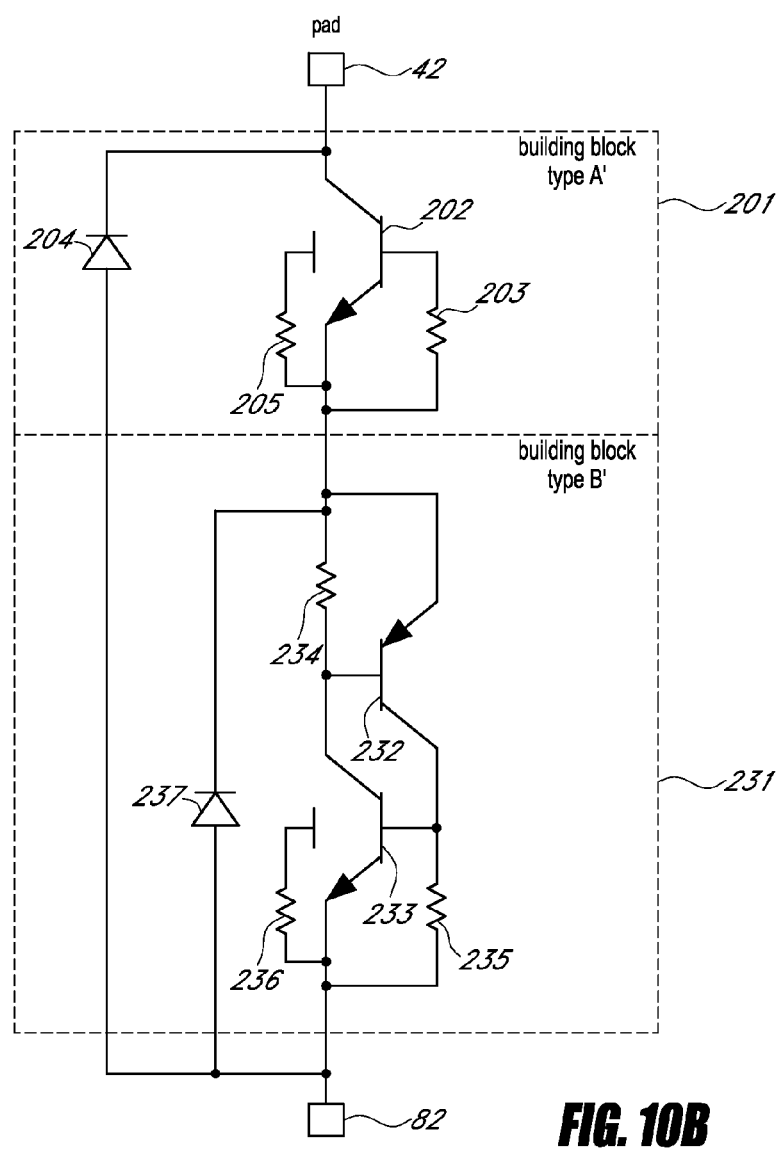
FIG. 10B is a circuit diagram of the pad circuit of FIG. 10A.

FIG. 10B is a circuit diagram of the pad circuit of FIG. 10A. The illustrated pad circuit 282 includes a Type A' building block 201 and a Type B' building block 231 connected in a cascade configuration between the pad 42 and the node 82. The Type A' building block 201 includes a first resistor 203, a second resistor 205, a diode 204, and a NPN bipolar transistor 202 having an emitter, a base, a collector, and a plate. Additional details of the Type A' building block 201 can be as described earlier with reference to FIG. 7A. The Type B' building block 231 includes a PNP transistor 232, a NPN bipolar transistor 233, a first resistor 234, a second resistor 235, a third resistor 236, and a diode 237. The PNP transistor 232 includes an emitter, a base, and a collector, and the NPN bipolar transistor 233 includes an emitter, a base, a collector and a plate. Additional details of the Type B' building block 231 can be as described earlier with reference to FIG. 8A.

Figures 11A, 11B:
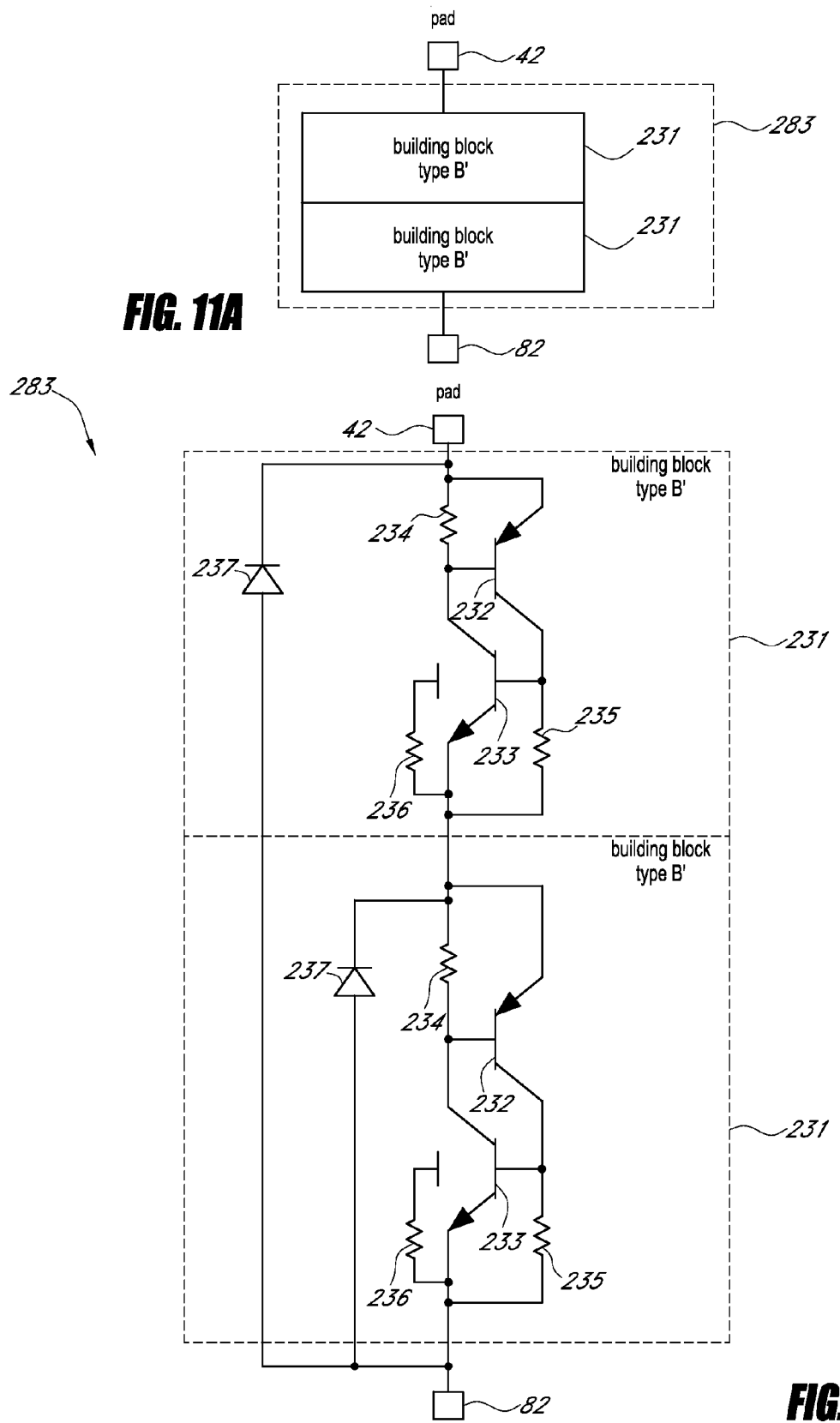
FIG. 11A is a schematic block diagram of a pad circuit according to a third embodiment.
FIG. 11B is a circuit diagram of the pad circuit of FIG. 11A.

FIG. 11A is a schematic block diagram of a pad circuit according to a third embodiment. The illustrated pad circuit 283 includes two Type B' building block 231 connected in a cascade between the pad 42 and the node 82. As described above, the Type B' building block 231 can be configured to have a trigger voltage $V_{T\_B'}$ equal to about the trigger voltage $V_{T\_A'}$ of the Type A' building block 201 of FIG. 7A. However, the holding voltage $V_{H\_B'}$ of the Type B' building block 231 can be configured to be greater than the holding voltage $V_{H\_A'}$ of the Type A' building block 201. Thus, the pad circuit 283 can be employed, for example, in an input pad having a relatively moderate operating voltage and requiring a relatively low holding voltage. For example, if $V_{T\_B'}$ is equal to about 9 V and $V_{H\_B'}$ is equal to about 2.5 V, the pad circuit 283 can have a trigger voltage of about 18 V and a holding voltage of about 5 V. Thus, the pad circuit 283 can have a holding voltage and trigger voltage appropriate for the pad VH3 in Table 1.

FIG. 11B is a circuit diagram of the pad circuit of FIG. 11A. The illustrated pad circuit 283 includes two Type B' building blocks 231 connected in a cascade configuration between the pad 42 and the node 82. Each Type B' building block 231 includes a PNP transistor 232, a NPN bipolar transistor 233, a first resistor 234, a second resistor 235, a third resistor 236, and a diode 237. The PNP transistor 232 includes an emitter, a base, and a collector, and the NPN bipolar transistor 233 includes an emitter, a base, a collector and a plate. Additional details of the Type B' building block 231 can be as described earlier with reference to FIG. 8A.

Figure 12A:
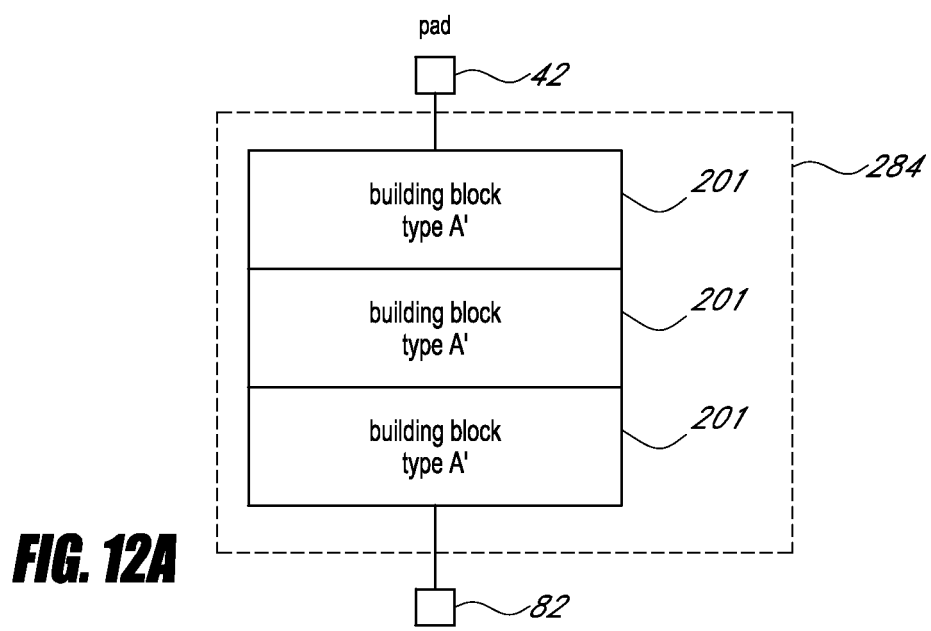
FIG. 12A is a schematic block diagram of a pad circuit according to a fourth embodiment.

FIG. 12A is a schematic block diagram of a pad circuit according to a fourth embodiment. The illustrated pad circuit 284 includes three Type A' building blocks 201 connected in a cascade between the pad 42 and the node 82. The Type A' building block 201 can be configured to have a trigger voltage $V_{T\_A'}$ equal to about the trigger voltage $V_{T\_B'}$ of the Type B' building block 231 of FIG. 8A. However, the holding voltage $V_{H\_A'}$ of the Type A' building block 201 can be configured to be greater than the holding voltage $V_{H\_B'}$ of the Type B' building block 231. Thus, the pad circuit 284 can be employed, for example, in an output pad having a relatively high operating voltage and requiring a relatively high holding voltage. For example, if $V_{T\_A'}$ is equal to about 9 V and $V_{H\_A'}$ is equal to about 5 V, the pad circuit 284 can have a trigger voltage of about 27 V and a holding voltage of about 15 V. Thus, the pad circuit 284 can have a holding voltage and trigger voltage appropriate for the pad OVERVOLTAGE in Table 1.

Figure 12B:
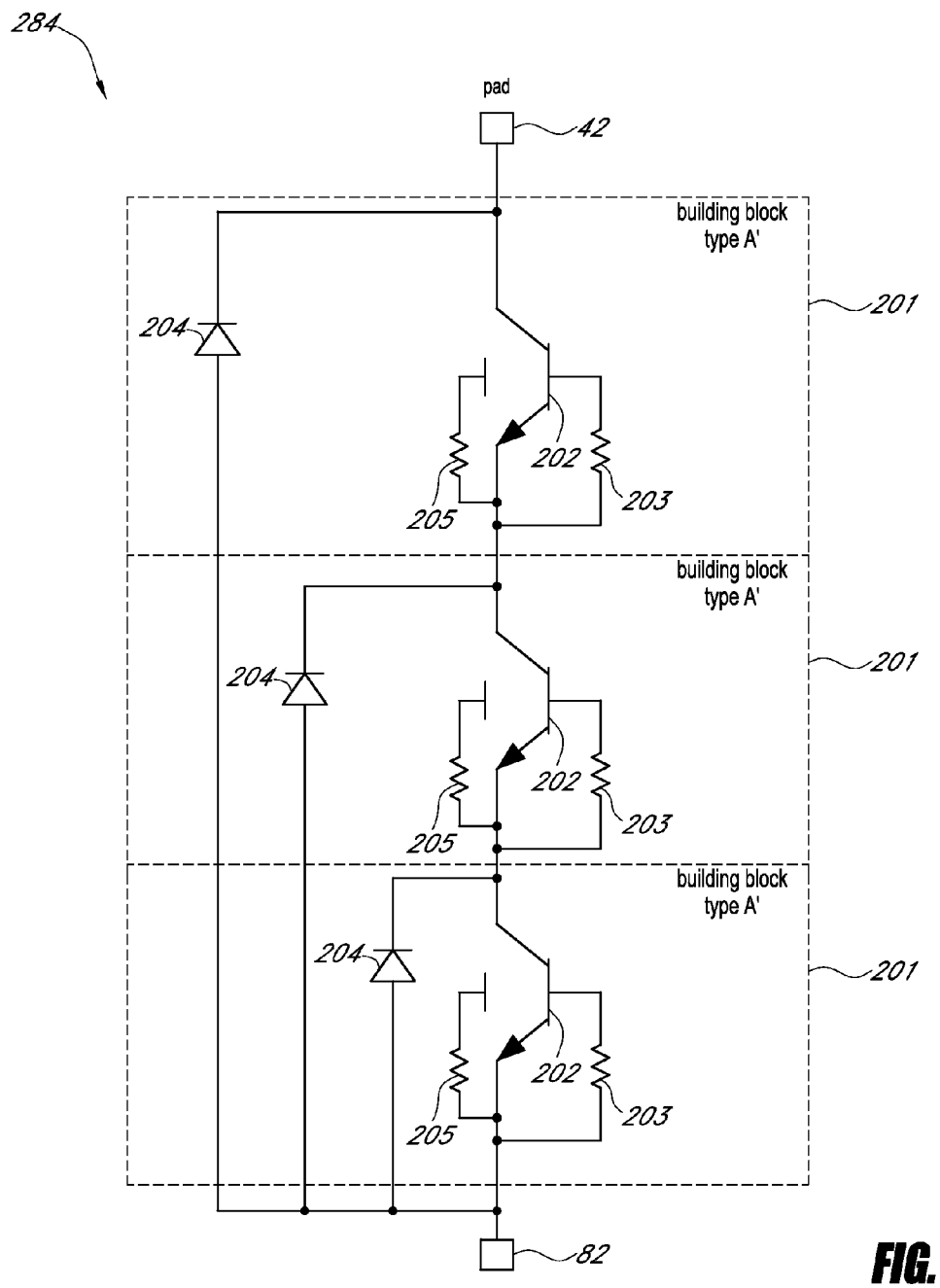
FIG. 12B is a circuit diagram of the pad circuit of FIG. 12A.

FIG. 12B is a circuit diagram of the pad circuit of FIG. 12A. The illustrated pad circuit 284 includes three Type A' building blocks connected in a cascade configuration between the pad 42 and the node 82. Each Type A' building block 201 includes a first resistor 203, a second resistor 205, a diode 204, and a NPN bipolar transistor 202 having an emitter, a base, a collector, and a plate. Additional details of the Type A' building block 201 can be as described earlier with reference to FIG. 7A.

Figure 13A:
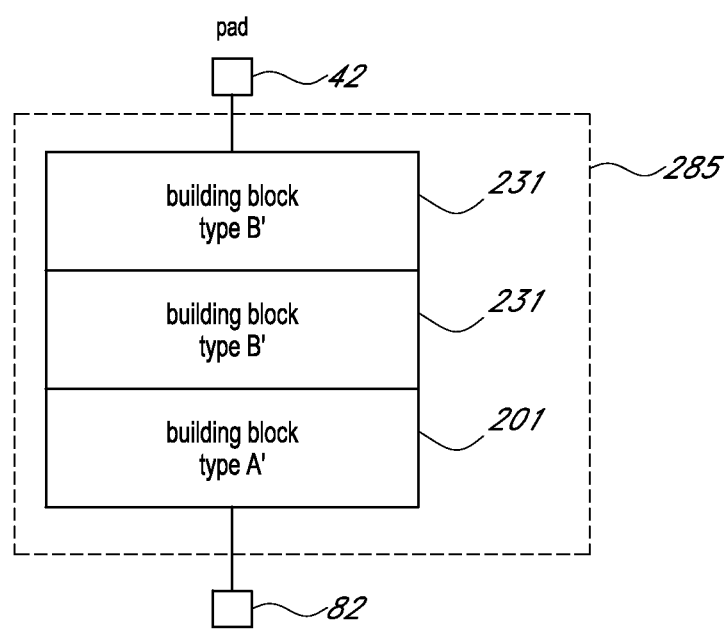
FIG. 13A is a schematic block diagram of a pad circuit according to a fifth embodiment.

FIG. 13A is a schematic block diagram of a pad circuit according to a fifth embodiment. The illustrated pad circuit 285 includes two Type B' building blocks 231 connected in a cascade with a Type A' building block 201 between the pad 42 and the node 82. As described above, the Type A' building block 201 can be configured to have a trigger voltage $V_{T\_A'}$ equal to about the trigger voltage $V_{T\_B'}$ of the Type B' building block 231. However, the holding voltage $V_{H\_A'}$ of the Type A' building block 201 can be configured to be greater than the holding voltage $V_{H\_B'}$ of the Type B' building block 231. Thus, the pad circuit 285 can be employed, for example, in an output pad having a relatively high operating voltage and requiring a relatively moderate holding voltage. For example, if $V_{T\_A'}$ and $V_{T\_B'}$ are equal to about 9 V, $V_{H\_A'}$ is equal to about 5 V, and $V_{H\_B'}$s equal to about 2.5 V, the pad circuit 285 can have a trigger voltage of about 27 V and a holding voltage of about 10 V. Thus, the pad circuit 285 can have a holding voltage and trigger voltage appropriate for the pad UNDERVOLTAGE in Table 1.

Figure 13B:
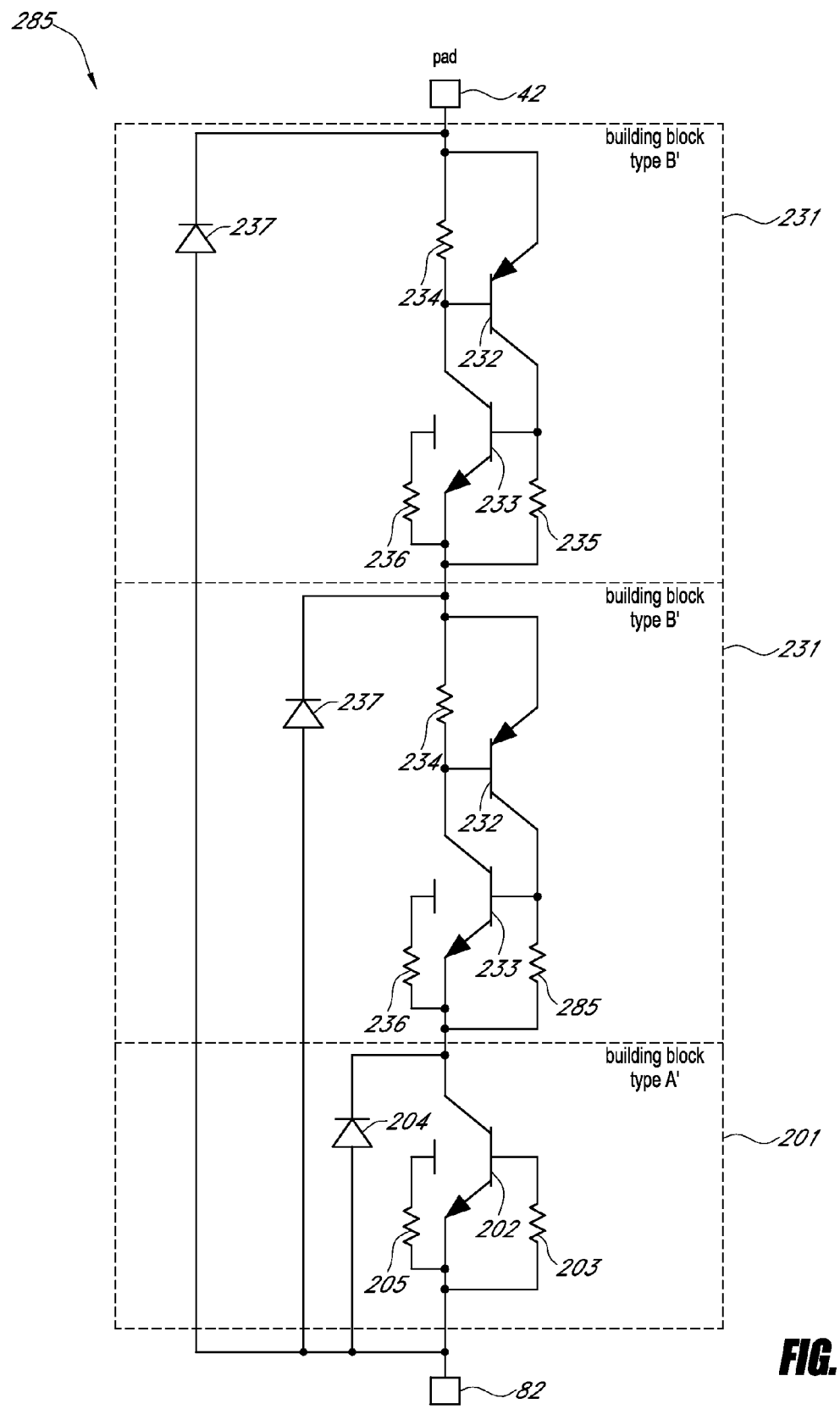
FIG. 13B is a circuit diagram of the pad circuit of FIG. 13A.

FIG. 13B is a circuit diagram of the pad circuit of FIG. 13A. The illustrated pad circuit 285 includes two Type B' building blocks 231 connected in a cascade with a Type A' building block 201 between the pad 42 and the node 82. The Type A' building block 201 includes a first resistor 203, a second resistor 205, a diode 204, and a NPN bipolar transistor 202 having an emitter, a base, a collector, and a plate. Additional details of the Type A' building block 201 can be as described earlier with reference to FIG. 7A. Each Type B' building block 231 includes a PNP transistor 232, a NPN bipolar transistor 233, a first resistor 234, a second resistor 235, a third resistor 236, and a diode 237. The PNP transistor 232 includes an emitter, a base, and a collector, and the NPN bipolar transistor 233 includes an emitter, a base, a collector and a plate. Additional details of the Type B' building block 231 can be as described earlier with reference to FIG. 8A.

Figure 14A:
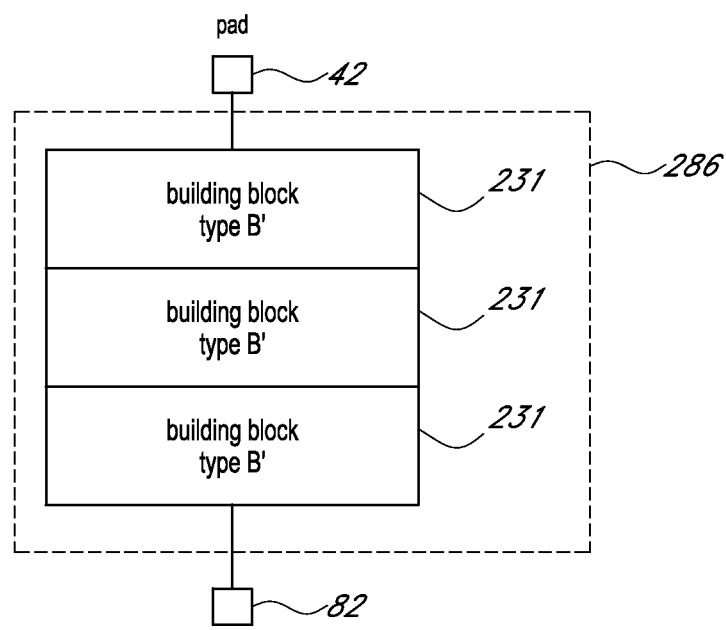
FIG. 14A is a schematic block diagram of a pad circuit according to a sixth embodiment.

FIG. 14A is a schematic block diagram of a pad circuit according to a sixth embodiment. The illustrated pad circuit 286 includes three Type B' building block 231 connected in a cascade between the pad 42 and the node 82. As described above, the Type B' building block 231 can be configured to have a trigger voltage $V_{T\_B'}$ equal to about the trigger voltage $V_{T\_A'}$ of the Type A' building block 201 of FIG. 7A. However, the holding voltage $V_{H\_B'}$ of the Type B' building block 231 can be configured to be greater than the holding voltage $V_{H\_A'}$ of the Type A' building block 201. Thus, the pad circuit 286 can be employed, for example, in an input pad having a relatively high operating voltage and requiring a relatively low holding voltage. For example, if $V_{T\_B'}$ is equal to about 9 V and $V_{H\_B'}$ is equal to about 2.5 V, the pad circuit 286 can have a trigger voltage of about 27 V and a holding voltage of about 7.5 V. Thus, the pad circuit 286 can have a holding voltage and trigger voltage appropriate for the pad VH4 in Table 1.

Figure 14B:
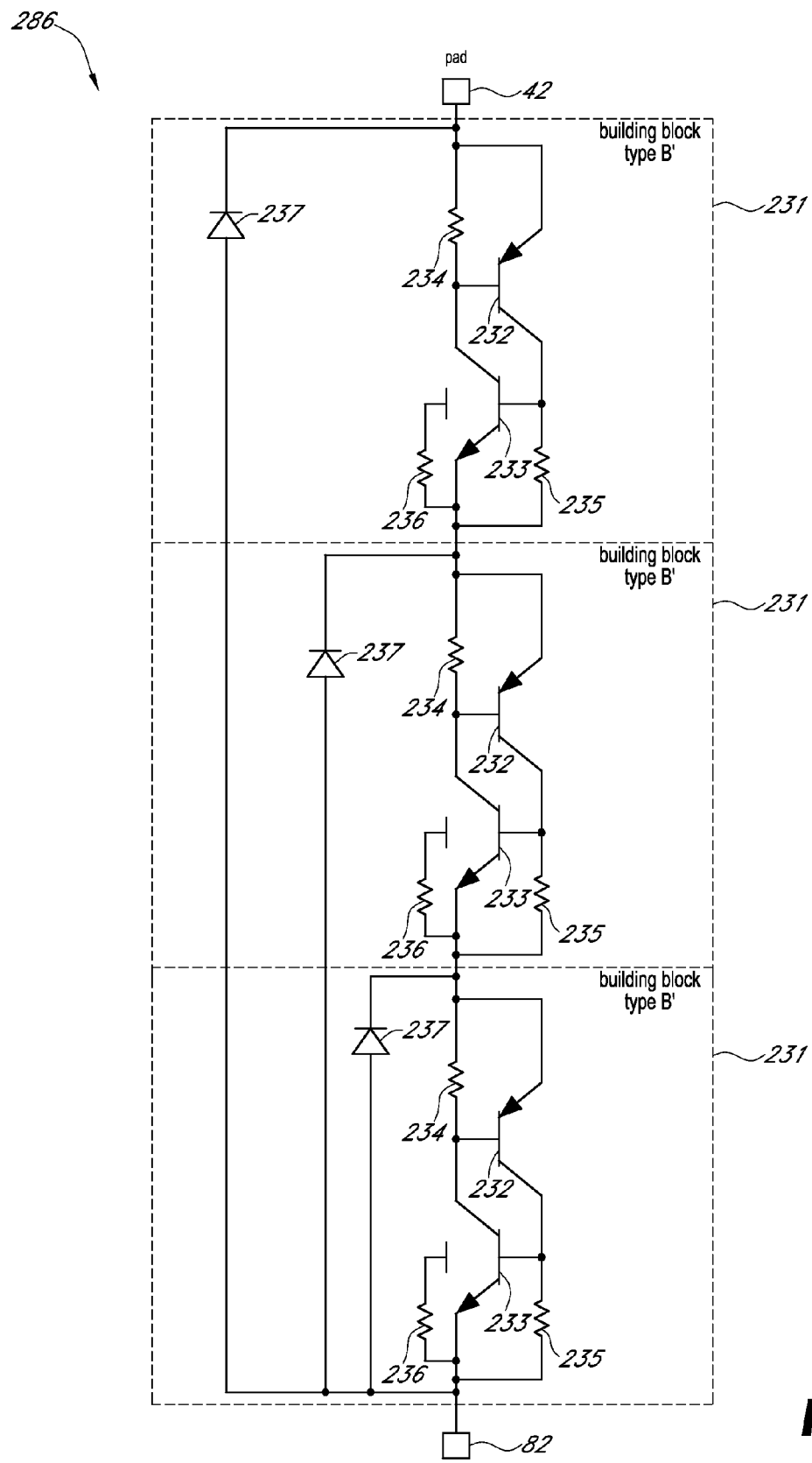
FIG. 14B is a circuit diagram of the pad circuit of FIG. 14B.

FIG. 14B is a circuit diagram of the pad circuit of FIG. 14B. The illustrated pad circuit 286 includes three Type B' building block 231 connected in a cascade between the pad 42 and the node 82. Each Type B' building block 231 includes a PNP transistor 232, a NPN bipolar transistor 233, a first resistor 234, a second resistor 235, a third resistor 236, and a diode 237. The PNP transistor 232 includes an emitter, a base, and a collector, and the NPN bipolar transistor 233 includes an emitter, a base, a collector and a plate. Additional details of the Type B' building block 231 can be as described earlier with reference to FIG. 8A.

In the embodiments shown in FIGS. 9A-14B, cascaded building block configurations employ Type A' and Type B' building blocks 201, 231. However, one or more additional building block types can be included. For example, a Type C' building block having a holding voltage $V_{H\_C'}$ and a trigger voltage $V_{T\_C'}$ can be utilized. The pad circuit 22 can combine i number of Type A' building blocks, j number of Type B' building blocks, and k number of Type C' building blocks such that the pad circuit 22 has a trigger voltage $V_{TRIGGER}$ roughly equal to about $i*V_{T\_A'}+j*V_{T\_B'}+k*V_{T\_C'}$, and a holding voltage $V_{HOLDING}$ roughly equal to about $i*V_{H\_A'}+j*V_{H\_B'}+k*V_{H\_C'}$. Providing additional types of building block can increase the multitude of configurations of the cascade at the expense of an increase in design complexity.

Figure 15:
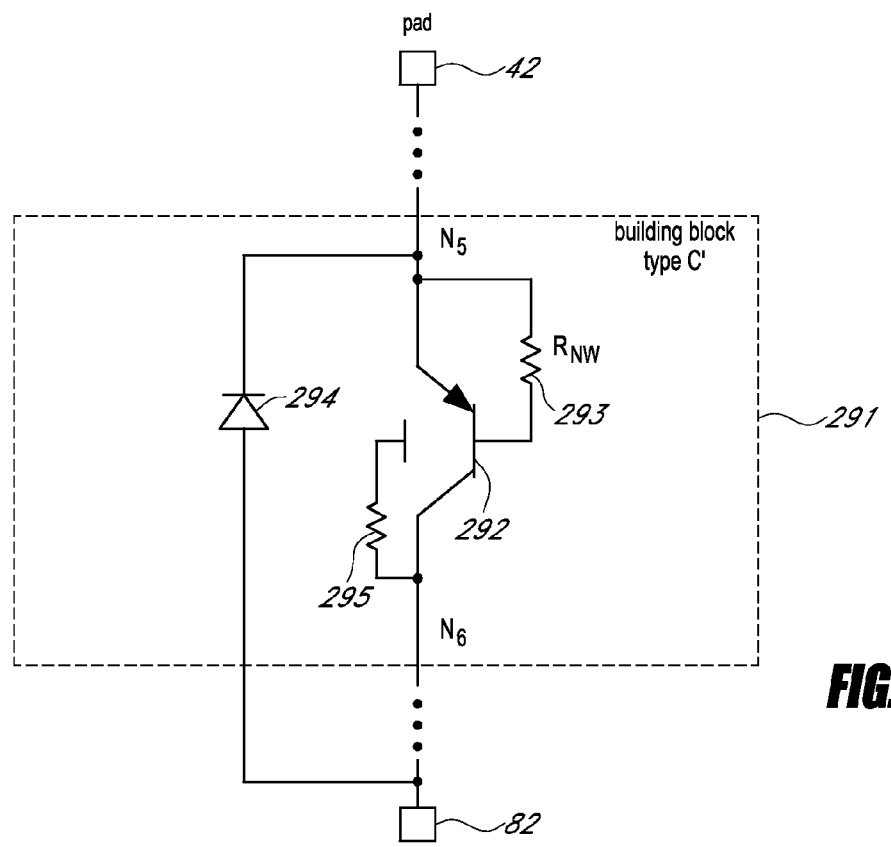
FIG. 15 is a circuit diagram illustrating a pad circuit building block in accordance with yet another embodiment.

FIG. 15 is a circuit diagram illustrating a pad circuit building block in accordance with yet another embodiment. The Type C' building block 291 can be connected in a cascade with other building blocks between the pad 42 and the node 82. The illustrated Type C' building block 291 includes a first resistor 293, a second resistor 295, a diode 294, and a PNP bipolar transistor 292 having an emitter, a base, a collector, and a plate. The PNP bipolar transistor 292 can have a structure similar to that of the PNP bipolar transistor 160 of FIG. 6C.

The diode 294 includes an anode electrically connected to the node 82, and a cathode electrically connected to the emitter of the PNP bipolar transistor 292 and to a first end of the first resistor 293 at a node $N_5$. The node $N_5$ can be electrically connected to another building block in a cascade, such as the cascaded building blocks of FIGS. 4A and 4B, or to the pad 42. The first resistor 293 includes a second end electrically connected to the base of the PNP bipolar transistor 292. The first resistor 293 can have, for example, a resistance between about 11Ω and about 85Ω. In one embodiment, the first resistor 293 is implemented using a multi-finger array to achieve the target resistance, such as an array of six fingers each having a resistance selected from the range of about 66Ω and about 510Ω. The second resistor 295 includes a first end electrically connected to the plate of the PNP bipolar transistor 292, and a second end electrically connected to the collector of the NPN bipolar transistor 292 at a node $N_6$. The second resistor 295 can have, for example, a resistance between about 200Ω and about 50 kΩ. The node $N_6$ can be electrically connected to another building block in a cascade or to the node 82.

The pad circuit 22 can be, for example, any of the pad circuits 22a-22p shown in FIG. 2, and the pad 42 can be any of the pads 42a-42p, including, for example, low-impedance output pads, high-impedance input pads, and low-impedance power pads. The node 82 can be, for example, a low impedance node or pad of the power management IC 20 configured to handle a relatively large shunted current. A transient signal event can be received at the pad 42. If the transient signal event has a voltage that is negative with respect to the node 82, the diode 294 can provide current which can aid in protecting the power management IC 20.

If the transient signal event has a voltage which is positive with respect to the node 82, the PNP bipolar transistor 292 can aid in providing transient signal protection. The trigger voltage of the Type C' building block $V_{T\_B'}$ can be based on the collector-emitter breakdown voltage of the PNP bipolar transistor 292. The Type C' building block can have a holding voltage $V_{H\_C'}$ greater than either the holding voltage $V_{H\_A'}$ or $V_{H\_B'}$. During normal operation, the absence of the LDD can make the leakage of the PNP bipolar transistor 292 low, even at relatively high temperatures. The PNP bipolar transistor 292 can have a lower leakage current as compared to a similarly sized PMOS transistor.

Figure 16A:
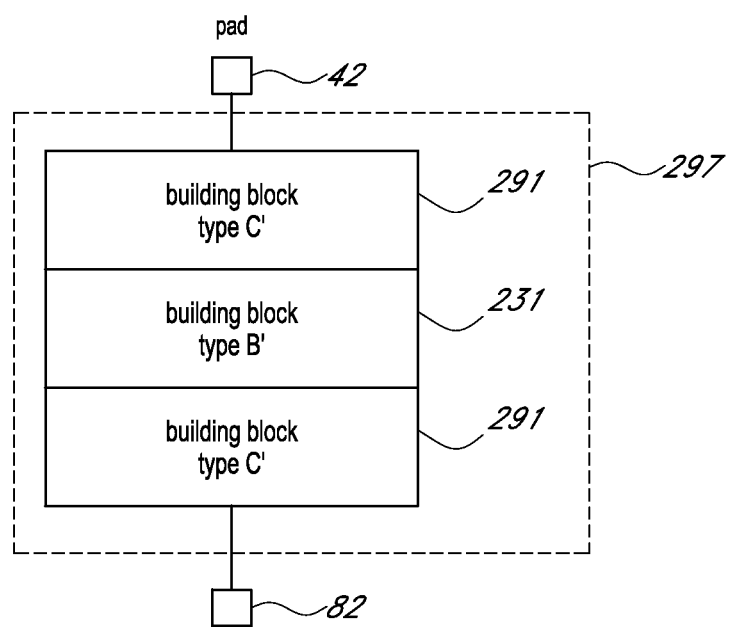
FIG. 16A is a schematic block diagram of a pad circuit according to a seventh embodiment.

FIG. 16A is a schematic block diagram of a pad circuit according to a seventh embodiment. The illustrated pad circuit 297 includes a Type C' building block 291, a Type B' building block 231, and a Type C' building block 291 connected in a cascade between the pad 42 and the node 82. As described above, the holding voltage $V_{H\_C'}$ of the Type C' building block 291 can be configured to be greater than the holding voltage $V_{H\_B'}$ of the Type B' building block 231 or the holding voltage $V_{H\_A'}$ of the Type A' building block 201. Furthermore, in certain processes, the leakage of the Type C' building block 291 can be less than that of the Type A' and Type B' building blocks 201, 231. Thus, the pad circuit 297 can be used, for example, in a very low leakage power pad having a relatively high operating voltage and requiring a relatively high holding voltage. For example, if $V_{T\_A'}$ and $V_{T\_B'}$ are equal to about 9 V, $V_{T\_C'}$ is equal to about 10 V, $V_{H\_B'}$ is equal to about 2.5 V, and $V_{H\_C'}$ is equal to about 10V, the pad circuit 285 can have a trigger voltage of about 29 V and a holding voltage of about 22.5 V. Thus, the pad circuit 297 can have a holding voltage and trigger voltage appropriate for the pad Vcc in Table 1. Additionally, in certain processes, the leakage current of the pad circuit 297 can be less than certain pad circuit configurations using only Type A' and Type B' building blocks, and thus pad circuit configurations with Type C' building blocks can be employed for very low leakage pads.

Figure 16B:
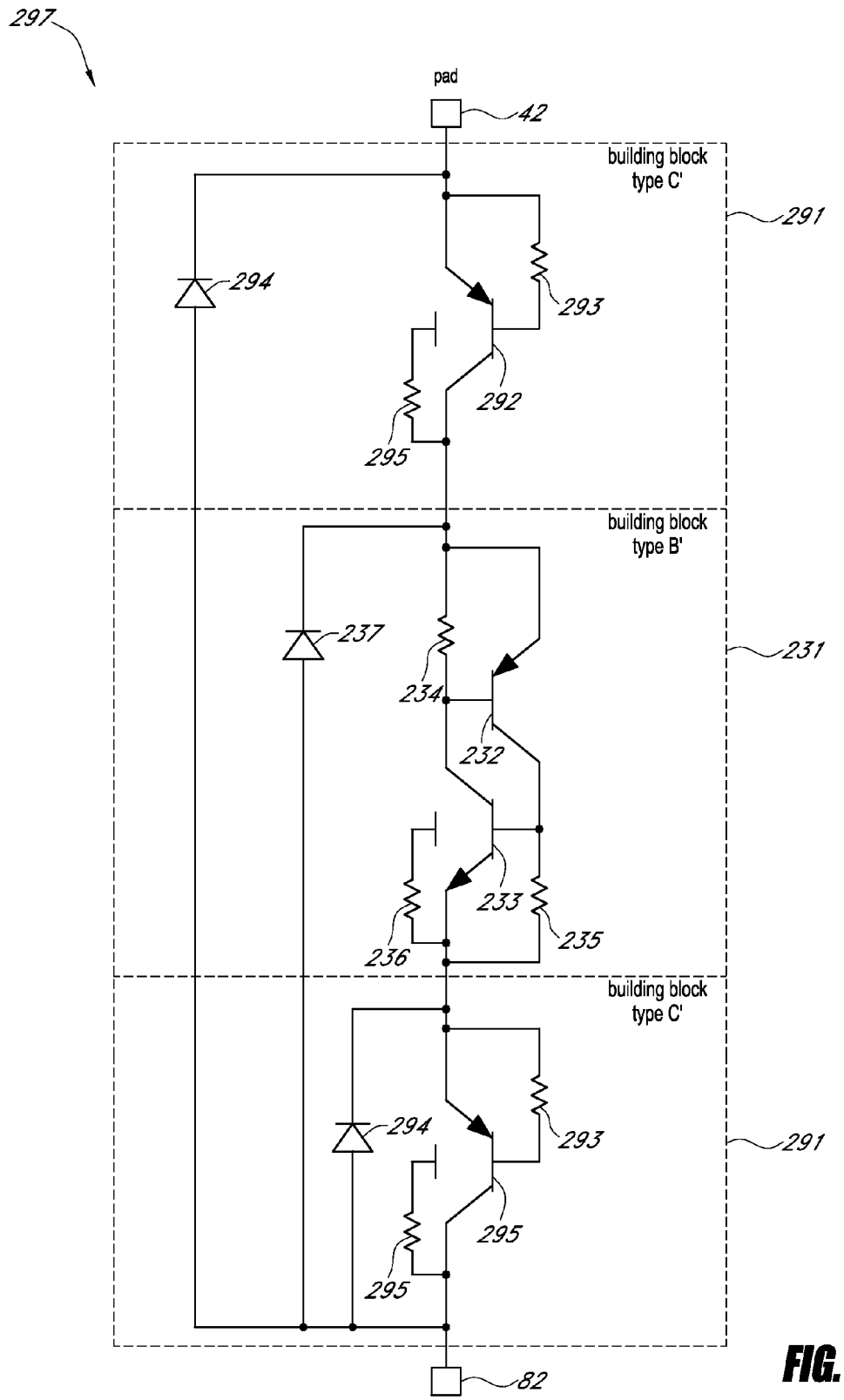
FIG. 16B is a circuit diagram of the pad circuit of FIG. 16A.

FIG. 16B is a circuit diagram of the pad circuit of FIG. 16A. The illustrated pad circuit 297 includes a Type C' building block 291, a Type B' building block 231, and a Type C' building block 291 connected in a cascade between the pad 42 and the node 82. Each Type C' building block 291 includes a first resistor 293, a second resistor 295, a diode 294, and a PNP bipolar transistor 292 having an emitter, a base, a collector, and a plate. Additional details of the Type C' building block 291 can be as described earlier with reference to FIG. 15. The Type B' building block 231 includes a PNP transistor 232, a NPN bipolar transistor 233, a first resistor 234, a second resistor 235, a third resistor 236, and a diode 237. The PNP transistor 232 includes an emitter, a base, and a collector, and the NPN bipolar transistor 233 includes an emitter, a base, a collector and a plate. Additional details of the Type B' building block 231 can be as described earlier with reference to FIG. 8A.

Figure 17A:
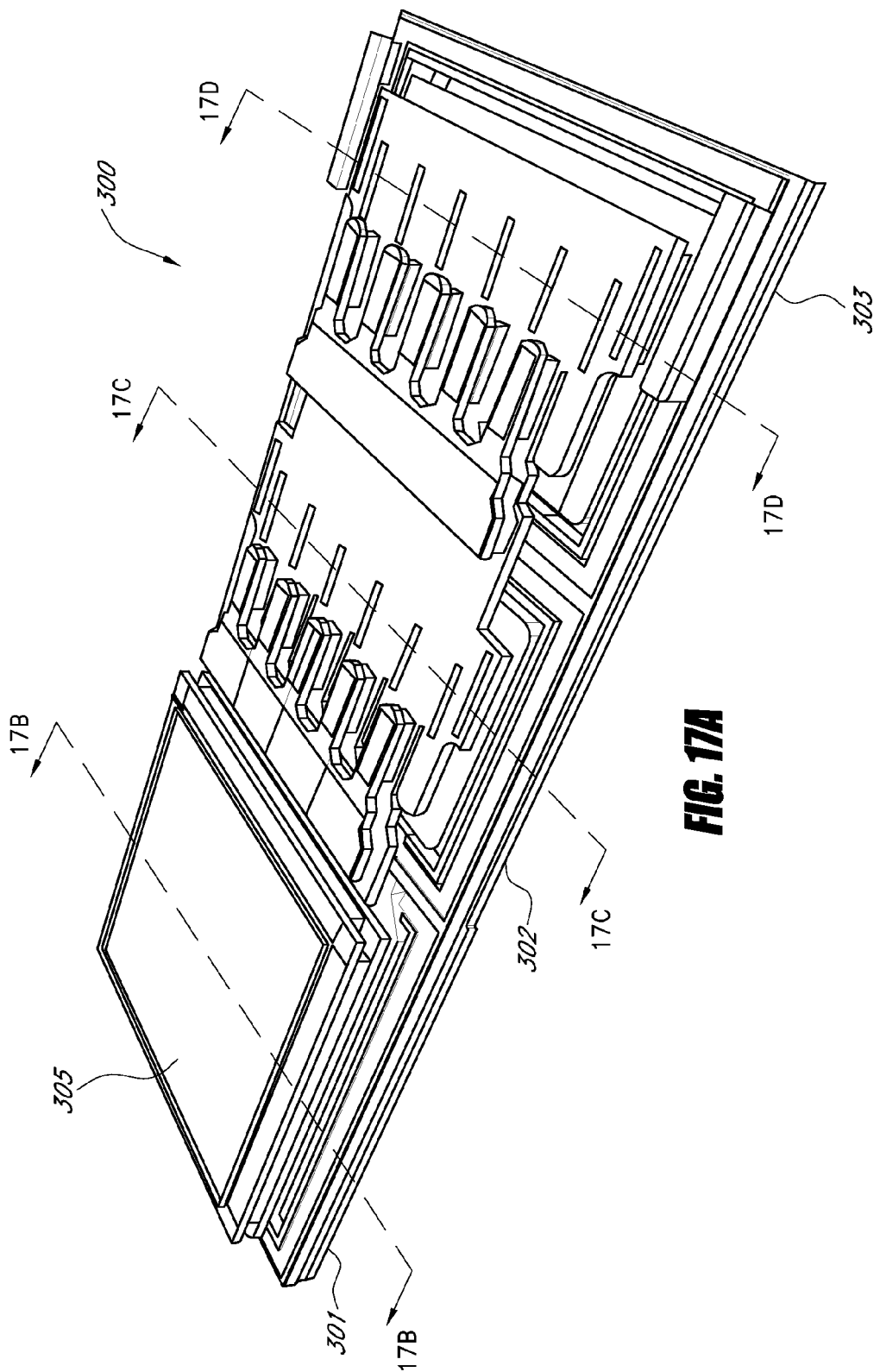
FIG. 17A is a perspective view of one implementation of the pad circuit of FIG. 12B.

FIG. 17A is a perspective view of one implementation of the pad circuit of FIG. 12B. The illustrated pad circuit 300 includes a bonding pad 305, a first Type A' building block 301, a second Type A' building block 302, and a third Type A' building block 303 connected in a cascade. The layout of the first Type A' building block 301 is configured such that the first Type A' building block 301 can fit below the bonding pad 305. The second and Type A' building blocks 302, 303 have layouts extending outside the bonding pad area.

During back-end fabrication (for example, fabrication of metal layers), building blocks can be included in a cascade configuration with the first Type A' building block. Thus, for example, the pad circuit 300 can be configured to have the configuration shown in FIG. 9B by changing the metal layers. Furthermore, additional building blocks, such as a Type B' building block can be placed adjacent to the pad 305, and can be included in the cascade by changing metal layers. Thus, an IC using the pad circuit 300, such as the power management IC 20, can be configured for a particular electronic system or application.

As will be described in further detail below with reference to FIGS. 17B-17I, the pad circuit 300 can advantageously be constructed with three metal layers, thereby permitting fabrication in processes with limited numbers of metal layers. Moreover, the pad circuit 300 can be implemented in a small circuit area, and a large portion of the pad circuit 300 can be positioned directly under the bonding pad 305.

FIG. 17B is a cross section of the pad circuit 300 of FIG. 17A taken along the line 17B-17B. The first Type A' building block 301 includes a substrate 307, plates 309, a deep n-well 310, n-wells 311, contacts 312, a first metal layer 313, first vias 314, a second metal layer 315, second vias 316, a third metal layer 317, and passivation layer 318. In contrast to the Type A' building block 201 shown in FIG. 7B, the first Type A' building block 301 is illustrated with back end processing. The deep n-well 310 and n-wells 311 can electrically isolate the first Type A' building block 301 from other building blocks, such as the second and third Type A' building blocks 302, 303. Additional details of the base layers of the first Type A' building block can be similar to those described earlier with reference to FIG. 7B.

Figure 17C:
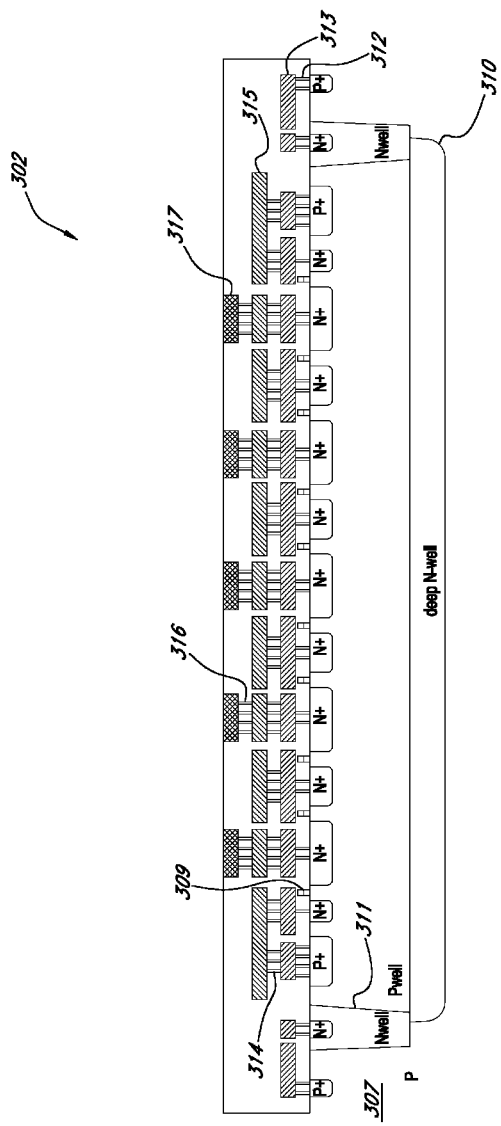
FIG. 17C is a cross section of the pad circuit of FIG. 17A taken along the line 17C-17C.

FIG. 17C is a cross section of the pad circuit of FIG. 17A taken along the line 17C-17C. The second Type A' building block 302 can be formed in the same substrate 307 as the first Type A' building block 301. The second Type A' building block 302 can include plates 309, a deep n-well 310, n-wells 311, contacts 312, a first metal layer 313, first vias 314, a second metal layer 315, second vias 316, and a third metal layer 317. Additional details of the base layers of the second Type A' building block 302 can be similar to those described earlier with reference to FIG. 7B. Skilled artisans will appreciate that the geometries of first Type A' building block 301 and the second Type B' building block 302 can be different. For example, the plates 309 of the first Type A' building block 301 can have different plate widths than the plates 309 of the second Type A' 302, as can been seen in FIG. 17E.

Figure 17D:
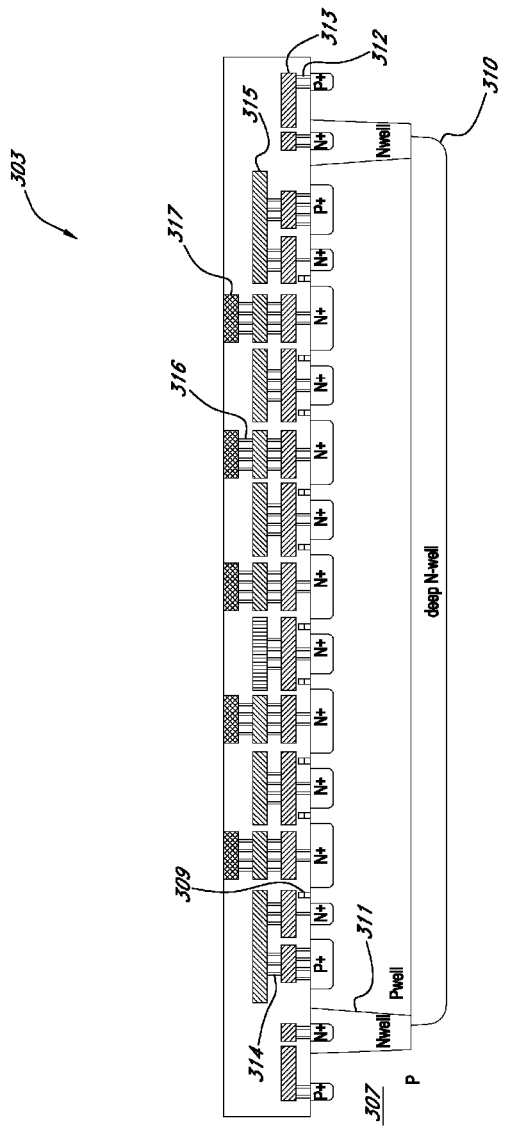
FIG. 17D is a cross section of the pad circuit of FIG. 17A taken along the line 17D-17D.

FIG. 17D is a cross section of the pad circuit of FIG. 17A taken along the line 17D-17D. The third Type A' building block 303 can be formed in the same substrate 307 as the first and second Type A' building blocks 301, 302. The third Type A' building block 303 can include plates 309, a deep n-well 310, n-wells 311, contacts 312, a first metal layer 313, first vias 314, a second metal layer 315, second vias 316, and a third metal layer 317. Additional details of the third Type A' building block 303 can be as described earlier in connection with FIG. 7B.

Figure 17E:
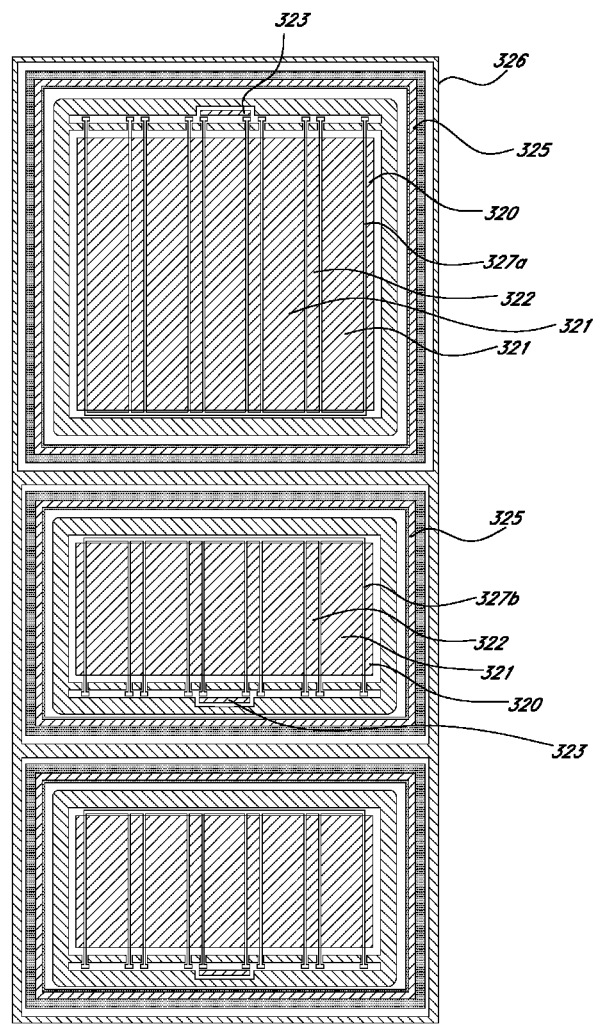
FIG. 17E is a top plan view of the active and polysilicon layers of the pad circuit of FIG. 17A.
Figure 17F:
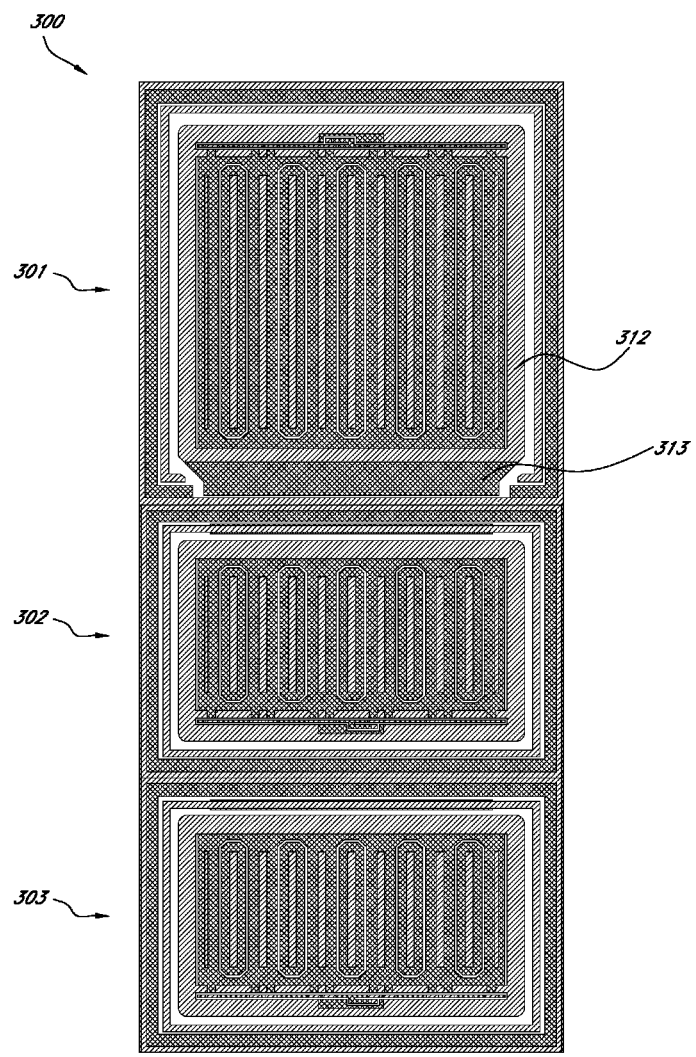
FIG. 17F is a top plan view of the contact and first metal layers of the pad circuit of FIG. 17A.

FIG. 17E is a top plan view of the active and polysilicon layers of the pad circuit of FIG. 17A. FIG. 17F is a top plan view of the contact and first metal layers of the pad circuit of FIG. 17A. As shown in FIG. 17E, each of the building blocks 301-303 includes a plurality of rows of emitters 320, 322 and a plurality of rows of collectors 321, when viewed from above. The rows of emitters 320, 322 and collectors 321 extend substantially parallel to one another. As shown in FIG. 17F, the emitters 320 on both of the peripheries of the pad circuit 300 can have a single row of contacts, while emitters 322 not on the peripheries of the pad circuit 300 and collectors 321 can have a double row of contacts.

Figure 17G:
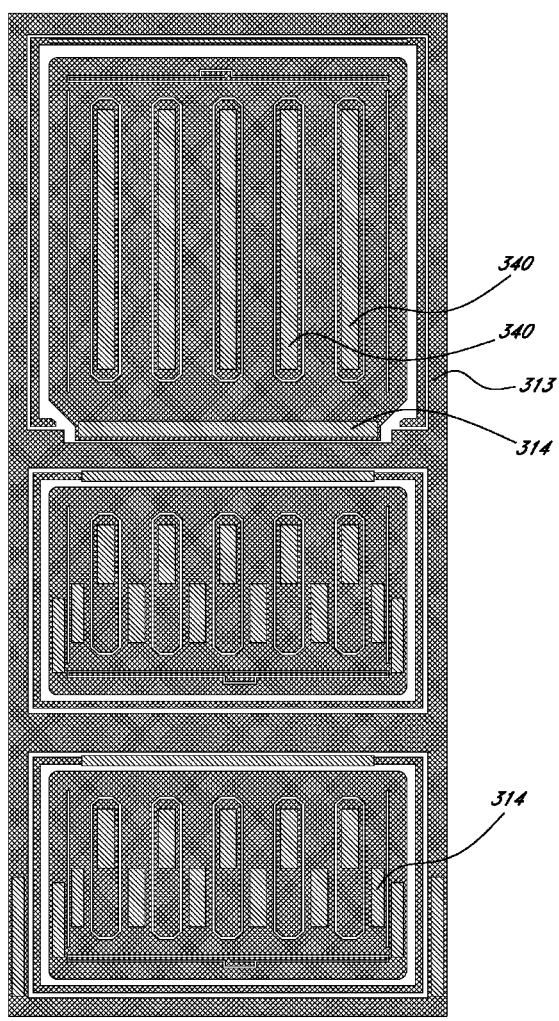
FIG. 17G is a top plan view of the first metal layer and first via layer of the pad circuit of FIG. 17A.
Figure 17H:
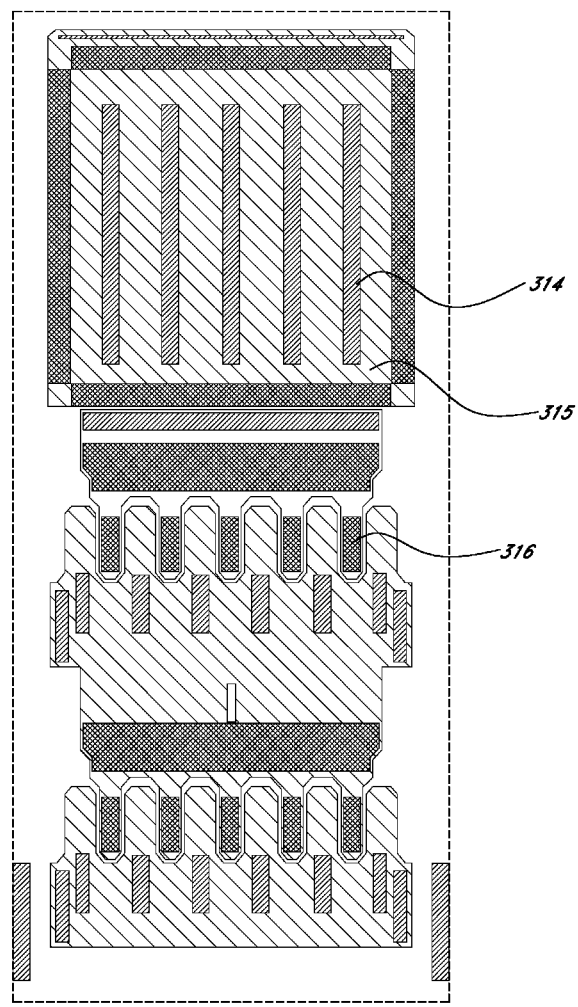
FIG. 17H is a top plan view of the second metal layer and second via layer of the pad circuit of FIG. 17A.

The contacts of the emitters 320, collectors 321 and emitters 322 can be spaced so as to permit first, and second vias to be stacked, as shown in FIGS. 17F-17H. The n-diffusion resistors 323 can have a resistance similar to that described above with reference to FIG. 7A. Each n-diffusion resistor 323 can have, for example, a width $W_R$ of 0.7 μm and a length $L_R$ of 9 μm.

As shown in FIGS. 17E-17F, a guard ring 325 can be connected through two rows of contacts. Additionally, a substrate guard ring 326 can be contacted with a double row of contacts. The plates 327a and plates 327b can each have ten fingers, and each plate can have a plate length of, for example, about 0.5 μm. The plates 327a can have a width of, for example, about 615 μm, and the plates 327b can have a width of, for example, about 300 μm. The contact to diffusion overlap can be, for example, about 2

Figure 17I:
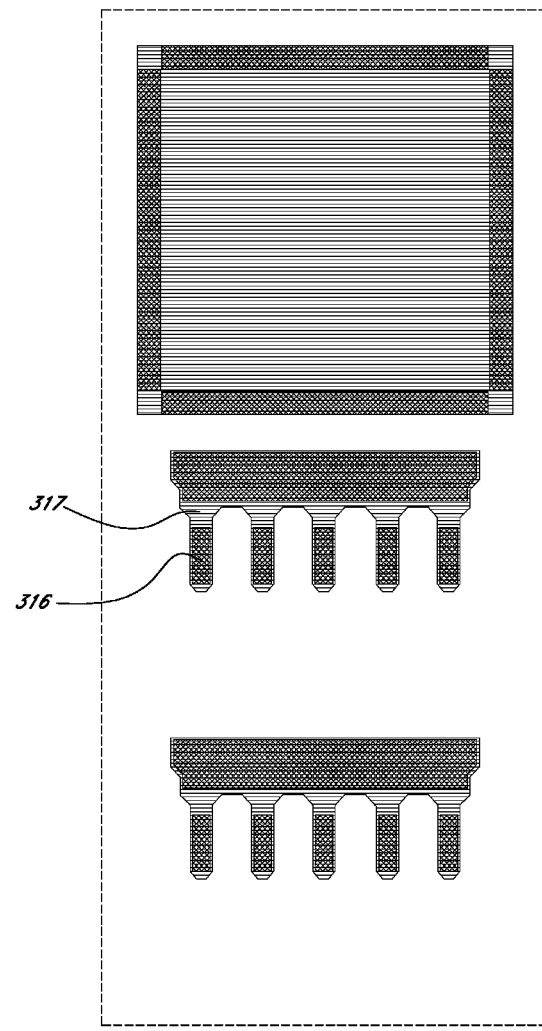
FIG. 17I is a top plan view of the third metal layer of the pad circuit of FIG. 17A.

FIG. 17G is a top plan view of the first metal layer 313 and first via layer 314 of the pad circuit of FIG. 17A. Four rows of vias 340 can be provided to contact the drains of NPN bipolar transistors. FIG. 17H is a top plan view of the first via layer 314, the second metal layer 315 and the second via layer 316 of the pad circuit of FIG. 17A. FIG. 17I is a top plan view of the third metal layer 317 and the second via layer 316 of the pad circuit of FIG. 17A.

Although FIGS. 17A-17I describe the construction and dimensions of one particular layout for a cascaded pad circuit, skilled artisans will appreciate that this example was for purposes of illustration. Pad circuit building blocks can be formed in a variety of ways, and can have different circuit layouts depending on a variety of factors, including, for example, fabrication process and application of the pad circuit.

FIG. 18A is a perspective view of one implementation of the pad circuit of FIG. 11B. The illustrated pad circuit 400 includes a first Type B' building block 401 and a second Type B' building block 402. The layout of the first and second Type B' building blocks 401, 402 is configured such that the both Type B' building blocks 401, 402 can fit below a bonding pad, which has been omitted from FIG. 18A for clarity. Additional building blocks, such as a Type A' building block, can be placed adjacent to the bonding pad, and can be included in the cascade, for example, by a change metal layers. Thus, an IC using the pad circuit 400, such as the power management IC 20, can be configured for a particular electronic system or application.

FIG. 18B is a cross section of the pad circuit of FIG. 18A taken along the line 18B-18B. The first Type B' building block 401 includes a substrate 407, plates 409, a deep n-wells 410, n-wells 411, contacts 412, a first metal layer 413, first vias 414, a second metal layer 415, second vias 416, a third metal layer 417, and passivation layer 418. In contrast to the Type B' building block 231 shown in FIG. 8B, the Type B' building blocks 401, 402 of FIG. 18B are illustrated with back end processing. The deep n-wells 410 and n-wells 411 can provide electrically isolation of building blocks, such as between first and second Type B' building blocks 401, 402, as well as electrical isolation of each building block from the substrate 407. Additional details of the base layers of the first Type B' building block can be similar to those described earlier in connection with FIG. 8B.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a substrate;
   a first p-well in the substrate, wherein the first p-well is configured to operate as a base of a first NPN bipolar transistor;
   a first p-type base contact region in the first p-well;
   an n-type isolation structure configured to electrically isolate the first p-well from the substrate, and wherein the n-type isolation structure is electrically connected to a first node;
   a first n-type emitter region in the first p-well, wherein the first n-type emitter region is configured to operate as an emitter of the first NPN bipolar transistor, and wherein the first n-type emitter region and the first p-type base contact region are electrically connected to a second node;
   a first n-type collector region at least partially in the first p-well and spaced apart from the first n-type emitter region, wherein the first n-type collector region is configured to operate as a collector of the first NPN bipolar transistor;
   a first conductive plate positioned adjacent a portion of the first p-well between the first n-type emitter region and the first n-type collector region; and
   a resistor electrically connected between the first conductive plate and the second node, wherein the first NPN bipolar transistor is configured to activate in response to an electrostatic discharge (ESD) event received between the first and second nodes, and wherein the first conductive plate provides an electrical path for current injection into the base of the first NPN bipolar transistor during the ESD event.

2. The apparatus of claim 1, further comprising a bonding pad positioned adjacent the substrate, wherein the first p-well and the n-type isolation structure are confined within an area of the bonding pad.

3. The apparatus of claim 1, wherein the resistor comprises at least one of n-diffusion or polysilicon.

4. The apparatus of claim 1, wherein the resistor has a resistance selected from the range of about 200Ω to about 50 kΩ.

5. The apparatus of claim 1, further comprising:
a first spacer adjacent a first side of the first conductive plate;
a second spacer adjacent a second side of the first conductive plate opposite the first side, wherein the first spacer and the second spacer are dielectric, and wherein a doping adjacent the first spacer, the second spacer, and the first conductive plate comprises p-type.

6. The apparatus of claim 5, wherein the doping adjacent the first spacer, the second spacer, and the first conductive plate does not include any lightly doped drain (LDD) regions.

7. The apparatus of claim 1, further comprising:
a first n-well positioned adjacent the first p-well, wherein the first n-well is configured to operate as a base of a first PNP bipolar transistor;
a first p-type emitter region in the first n-well, wherein the first p-type emitter region is configured to operate as an emitter of the first PNP bipolar transistor; and
a first n-type base contact region in the first n-well, wherein the first n-type base contact region and the first p-type emitter region are electrically connected to the first node,
wherein the first p-well is further configured to operate as a collector of the first PNP bipolar transistor.

8. The apparatus of claim 7, wherein a first portion of the first n-type collector region is disposed in the first p-well, and wherein a second portion of the first n-type collector region is disposed in the first n-well.

9. The apparatus of claim 7, further comprising:
a second p-well in the substrate, wherein the first n-well is positioned between the first and second p-wells, wherein the n-type isolation structure is further configured to electrically isolate the second p-well from the substrate, and wherein the second p-well is configured to operate as a base of a second NPN bipolar transistor;
a second p-type base contact region in the second p-well;
a second n-type emitter region in the second p-well, wherein the second n-type emitter region is configured to operate as an emitter of the second NPN bipolar transistor, and wherein the second n-type emitter region and the second p-type base contact region are electrically connected to the second node;
a second n-type collector region at least partially in the second p-well and spaced apart from the second n-type emitter region, wherein the second n-type collector region is configured to operate as a collector of the second NPN bipolar transistor; and
a second conductive plate positioned adjacent a portion of the second p-well between the second n-type emitter region and the second n-type collector region, wherein the second conductive plate is electrically connected to the first conductive plate.

10. The apparatus of claim 9, further comprising:
a second p-type emitter region in the first n-well, wherein the second p-type emitter region is configured to operate as an emitter of the second PNP bipolar transistor; and
a second n-type base contact region in the first n-well, wherein the second n-type base contact region and the second p-type emitter region are electrically connected to the first node, wherein the first n-well is further configured to operate as a base of the second PNP bipolar transistor, and wherein the second p-well is further configured to operate as a collector of the second PNP bipolar transistor.

11. The apparatus of claim 10, further comprising a bonding pad positioned adjacent the substrate, wherein the first p-well, the second p-well, the first n-well, and the n-type isolation structure are confined within an area of the bonding pad.

12. The apparatus of claim 1, wherein the n-type isolation structure comprises a deep n-well region and one or more n-wells.

13. The apparatus of claim 1, wherein the first conductive plate comprises polysilicon.

14. The apparatus of claim 13, further comprising an oxide layer disposed between the first conductive plate and the first p-well.

15. An apparatus comprising:
a substrate;
a first p-well in the substrate, wherein the first p-well is configured to operate as a base of a first NPN bipolar transistor;
a first n-type emitter region in the first p-well, wherein the first n-type emitter region is configured to operate as an emitter of the first NPN bipolar transistor;
a first n-type collector region spaced apart from the first n-type emitter region, wherein the first n-type collector region includes a first portion disposed in the first p-well, wherein the first n-type collector region is configured to operate as a collector of the first NPN bipolar transistor;
a first conductive plate positioned adjacent a portion of the first p-well between the first n-type emitter region and the first n-type collector region;
a first spacer adjacent a first side of the first conductive plate;
a second spacer adjacent a second side of the first conductive plate opposite the first side, wherein the first spacer and the second spacer are dielectric, and wherein a doping adjacent the first spacer, the second spacer, and the first conductive plate consists essentially of p-type;
a first n-well positioned on a first side the first p-well, wherein the first n-well is configured to operate as a base of a first PNP bipolar transistor, and wherein the first n-type collector region further includes a second portion disposed in the first n-well;
a first p-type emitter region in the first n-well, wherein the first p-type emitter region is configured to operate as an emitter of the first PNP bipolar transistor, wherein the first p-well is further configured to operate as a collector of the first PNP bipolar transistor;
a second n-well positioned on a second side the first p-well opposite the first side, wherein the second n-well comprises a first guard ring.

16. The apparatus of claim 15, further comprising:
a third p-well in the substrate, wherein the third p-well is configured to operate as a base of a second NPN bipolar transistor;
a second n-type emitter region in the second p-well, wherein the second n-type emitter region is configured to operate as an emitter of the second NPN bipolar transistor;
a second n-type collector region spaced apart from the second n-type emitter region, wherein the second n-type collector region includes a first portion disposed in the second p-well, and wherein the second n-type collector region is configured to operate as a collector of the second NPN bipolar transistor;
a second conductive plate positioned adjacent a portion of the second p-well between the second n-type emitter region and the second n-type collector region;
a third spacer adjacent a first side of the second conductive plate;
a fourth spacer adjacent a second side of the second conductive plate opposite the first side, wherein the third spacer and the fourth spacer are dielectric, and wherein a doping adjacent the third spacer, the fourth spacer, and the second conductive plate consists essentially of p-type;
a third n-well positioned on a first side the second p-well, wherein the third n-well is configured to operate as a base of a second PNP bipolar transistor, wherein the second n-type collector region further includes a second portion disposed in the third n-well; and
a second p-type emitter region in the third n-well, wherein the second p-type emitter region is configured to operate as an emitter of the second PNP bipolar transistor, wherein the second p-well is further configured to operate as a collector of the second PNP bipolar transistor.

17. The apparatus of claim 16, wherein the first guard ring comprises a deep n-well layer.

18. The apparatus of claim 16, wherein the first guard ring and the first n-type emitter region are electrically connected.

19. The apparatus of claim 16, further comprising a fourth n-well positioned on a second side the second p-well opposite the first side, wherein the fourth n-well comprises a second guard ring.

20. The apparatus of claim 16, further comprising a resistor having a first end electrically connected to the first conductive plate and a second end electrically connected to the first n-type emitter region.

21. The apparatus of claim 20, wherein the resistor has a resistance selected from the range of about 200Ω to about 50 kΩ.

* * * * *